(12) United States Patent
Sugishita et al.

(10) Patent No.: US 7,727,780 B2
(45) Date of Patent: Jun. 1, 2010

(54) SUBSTRATE PROCESSING METHOD AND SEMICONDUCTOR MANUFACTURING APPARATUS

(75) Inventors: Masashi Sugishita, Toyama (JP); Masaaki Ueno, Toyama (JP); Akira Hayashida, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 165 days.

(21) Appl. No.: 12/010,274

(22) Filed: Jan. 23, 2008

(65) Prior Publication Data

US 2008/0182345 A1 Jul. 31, 2008

(30) Foreign Application Priority Data

Jan. 26, 2007 (JP) ............................. 2007-015716
Sep. 6, 2007 (JP) ............................. 2007-231252

(51) Int. Cl.
  *G01R 31/26* (2006.01)
  *H01L 21/66* (2006.01)

(52) U.S. Cl. .................... 438/14; 438/680; 438/905; 257/E21.17; 257/E21.32; 257/E21.054; 257/E21.082; 257/E21.267; 257/E21.274; 257/E21.311; 257/E21.521

(58) Field of Classification Search .............. 438/14, 438/310, 311, 509, 513, 680, 770, 905, 913; 257/48, 77, 347, 359, E21.17, E21.32, E21.054, 257/E21.082, E21.267, E21.274, E21.311, 257/E21.521

See application file for complete search history.

(56) References Cited

U.S. PATENT DOCUMENTS

| | | | | |
|---|---|---|---|---|
| 6,864,463 B2* | 3/2005 | Ikeda | .......................... | 219/390 |
| 7,024,266 B2* | 4/2006 | Edo | .......................... | 700/112 |
| 7,472,581 B2* | 1/2009 | Kitazawa et al. | ............. | 73/49.2 |
| 2003/0021671 A1* | 1/2003 | Edo | .......................... | 414/939 |
| 2006/0207314 A1* | 9/2006 | Kitazawa et al. | ............. | 73/49.2 |

FOREIGN PATENT DOCUMENTS

| | | |
|---|---|---|
| JP | A 5-121344 | 5/1993 |
| JP | A 2002-75890 | 3/2002 |
| JP | A 2002-299257 | 10/2002 |
| JP | A 2002-299269 | 10/2002 |
| JP | A 2003-31510 | 1/2003 |
| JP | A 2005-183596 | 7/2005 |
| WO | WO 2005/008755 A1 | 1/2005 |

* cited by examiner

Primary Examiner—David Nhu
(74) Attorney, Agent, or Firm—Oliff & Berridge, PLC

(57) ABSTRACT

A semiconductor manufacturing apparatus and substrate processing method includes a step of acquiring a measurement value based on a first detecting and a second detecting section and determining a first difference of measurement values between the first detecting section and the second detecting section, comparing between a previously stored second difference between measurement values concerning the first detecting section and the second detecting section, calculating a correction value for a pressure in a cooling-gas passage provided between a process chamber and a heating device depending upon the first difference when the first difference is different from the second difference, and correcting the pressure value based on the pressure correction value, and a step of processing the substrate by flowing a cooling gas through the cooling-gas passage while heating the process chamber, and placing the heating device and the cooling device under a control section depending upon a pressure value corrected.

19 Claims, 19 Drawing Sheets

FIG. 16

| NO | TEMPERATURE SETTING VALUE | PRESSURE MEASUREMENT VALUE | TEMPERATURE CORRECTION VALUE AT WAFER CENTER | TEMPERATURE CORRECTION VALUE AT BOAT CEILING |
|---|---|---|---|---|
| 1 | 600°C | 0Pa | 0°C | 0°C |
| 2 | 600°C | 200Pa | -5°C | -2°C |
| 3 | 600°C | 300Pa | -7°C | -4°C |
| 4 | 600°C | 500Pa | -10°C | -6°C |
| 5 | 600°C | 800Pa | -13°C | -9°C |

FIG. 19

| NO | TEMPERATURE SETTING VALUE | PRESSURE MEASUREMENT VALUE | FILM THICKNESS |
|---|---|---|---|
| 1 | 600°C | 0Pa | 500Å |
| 2 | 600°C | 200Pa | 580Å |
| 3 | 600°C | 300Pa | 630Å |
| 4 | 600°C | 500Pa | 730Å |
| 5 | 600°C | 800Pa | 850Å |

SUBSTRATE PROCESSING METHOD AND SEMICONDUCTOR MANUFACTURING APPARATUS

This application claims the benefit of Japanese Patent Application No. 2007-015716 filed Jan. 26, 2007, and Japanese Patent Application No. 2007-231252 filed Sep. 6, 2007. The disclosure of the prior applications is hereby incorporated by reference herein in its entirety.

BACKGROUND OF THE INVENTION

1. Field of the Invention

The present invention relates to a substrate processing method and semiconductor manufacturing apparatus for processing a substrate, such as a semiconductor wafer.

2. Description of the Related Art

International Publication No. 2005/008755 discloses, in its pamphlet, a substrate processing apparatus that the film is to be formed uniform in thickness while controlling the heating temperature on the substrate by determining a change temperature amount N for realizing a desired mean temperature difference M through use of the difference, between a temperature at the end of and a temperature at the center of the substrate, occurring upon changing the heating temperature in a predetermined time and the steady-state difference in temperature at between the end and the center of the substrate.

However, even where a desired mean temperature difference M is realized, the film formed on a substrate is limited in thickness uniformity.

Meanwhile, there is known a semiconductor manufacturing apparatus that is arranged with a plurality of temperature sensors to detect an interior temperature of the reactor so that the interior of the reactor can be controlled at a predetermined temperature by use of a temperature control device depending upon the detected temperature.

However, in such a semiconductor manufacturing apparatus, there is a problem that the interior temperature of the reactor tends to fluctuate and hence the film formed on the substrate readily varies in thickness where conducted maintenance or exchanged the temperature sensor as compared to that in newly starting the use of the apparatus.

This problem is considered mainly responsible for the errors in mounting quartz members, e.g. temperature sensors and outer and inner tubes. There is a difficulty in eliminating the mount errors perfectly.

Furthermore, there is known a semiconductor manufacturing apparatus having a rapid-cooling mechanism for cooling the interior temperature of the reactor rapidly. In the rapid-cooling mechanism of the semiconductor manufacturing apparatus, connection is provided between a gas outlet port of its rapid-cooling blower and an exhaust equipment of a factory or the like where the semiconductor manufacturing apparatus is installed.

However, such a semiconductor manufacturing apparatus involves a problem that the film formed is non-uniform in thickness and quality due to the variation of cooling capability at the cooling mechanism during film forming because exhaust pressure varies at the exhaust equipment.

SUMMARY OF THE INVENTION

It is an object of the present invention to provide a substrate processing method and semiconductor manufacturing apparatus with which the film formed on a substrate can be controlled in thickness and quality.

In accordance with a first aspect of the invention, there is provided a substrate processing method comprising: a step of acquiring a measurement value based on a first detecting section for detecting a state of a peripheral edge of a substrate and a measurement value based on a second detecting section for detecting a state of a center of the substrate and determining a first difference between the measurement value based on the first detecting section and the measurement value based on the second detecting section, comparing between a previously stored second difference between a measurement value concerning the first detecting section and a measurement value concerning the second detecting section with the first difference between the measurement value based on the first detecting section and the measurement value based on the second detecting section, calculating a correction value for a pressure in a cooling-gas passage provided between a process chamber for processing the substrate and a heating device depending upon the first difference when the first difference is different from the second difference, and correcting the pressure value based on the pressure correction value; and a step of processing the substrate by flowing a cooling gas through the cooling-gas passage by means of a cooling device while heating the process chamber by the heating device, and placing the heating device and the cooling device under control of a control section depending upon a pressure value corrected.

Preferably, the substrate processing step is to place the substrate at the center and peripheral edge thereof under temperature control by cooling the peripheral edge of the substrate while heating the center of the substrate up to a predetermined process temperature by controlling pressure depending upon the pressure value corrected.

Preferably, the first detecting section is a first temperature detecting section arranged close to the peripheral edge of the substrate, the second detecting section having a second temperature detecting section arranged in a substrate holder supporting the substrate in a position between substrates, arranged above the substrate holder or arranged below the substrate holder.

Preferably, the pressure value correcting step has a step of determining the first difference upon heating the process chamber by the heating device such that temperature becomes a predetermined setting value at the center of the substrate in the process chamber, a step of comparing between the first difference and the second difference for the predetermined setting value of temperature and calculating a correlating relationship between a pressure value through the cooling-gas passage for the predetermined setting value of temperature and the first difference when the first difference is different from the second difference, and a step of updating the pressure setting value depending upon the correlating relationship calculated.

Preferably, calculated two or more are correlating relationships between a pressure value through the cooling-gas passage for the predetermined setting value of temperature and the first in-plane difference.

Preferably, the pressure setting value is detected by a pressure detector that measures an interior pressure value of the cooling-gas outlet passage, communicating with the cooling-gas passage, downwardly of the cooling-gas passage provided between the process chamber and the heating device.

Preferably, the pressure value correcting step is to correct the pressure value in a manner controlling the uniformity of a film on the substrate.

Preferably, the substrate processing step is to form a film on the substrate by flowing a process gas into the process chamber.

In accordance with a second aspect of the invention, there is provided a substrate processing method comprising: a step of processing the substrate by flowing a cooling gas by a cooling device into a cooling-gas passage provided between the process chamber and the heating device while heating the process chamber for processing the substrate by a heating device and controlling the heating device and the cooling device by a control section depending upon an interior pressure value of the cooling-gas passage; and a step of comparing between a first film thickness value previously measured on the substrate and a second film thickness value determined in the substrate processing step, and calculating a pressure correction value depending upon the second film thickness value and correcting the pressure value based on the pressure correction value when the first film thickness value is different from the second film thickness value.

Preferably, there is further comprises of a step of processing a substrate by flowing a cooling gas through the cooling-gas passage by means of the cooling device while heating the process chamber by means of the heating device, and by controlling the heating device and the cooling device by means of the control section depending upon the pressure correction value.

Preferably, the pressure value correcting step has a step of determining the second film thickness value upon heating the process chamber by means of the heating device such that temperature becomes a predetermined setting value at the center of the substrate in the process chamber, a step of comparing between the second film thickness value and the first film thickness value for the predetermined setting value of temperature and calculating a correlating relationship between a pressure value through the cooling-gas passage for the predetermined setting value of temperature and the second film thickness value when the first film thickness value is different from the second film thickness value, and a step of updating the pressure setting value depending upon the correlating relationship calculated.

Preferably, calculated two or more are correlating relationships between a pressure value through the cooling-gas passage for the predetermined setting value of temperature and the first in-plane difference.

Preferably, the pressure setting value is detected by a pressure detector that measures an interior pressure value of the cooling-gas outlet passage, communicating with the cooling-gas passage, downstream of the cooling-gas passage provided between the process chamber and the heating device.

Preferably, the pressure value correcting step is to correct the pressure value in a manner controlling the uniformity of a film on the substrate.

Preferably, the substrate processing step is to form a film on the substrate by flowing a process gas into the process chamber.

In accordance with a third aspect of the invention, there is provided a semiconductor manufacturing apparatus comprising: a process chamber for processing a substrate; a heating device for heating the process chamber; a cooling-gas passage provided between the process chamber and the heating device; a pressure detector for measuring an interior pressure value of the cooling-gas passage; and a control section for processing the substrate by controlling the heating device and the cooling device that cools the substrate at a periphery thereof; whereby the control section acquires a measurement value based on a first detecting section for detecting a state of a peripheral edge of the substrate and a measurement value based on a second detecting section for detecting a state of a center of the substrate and determines a first difference between the measurement value based on the first detecting section and the measurement value based on the second detecting section, compares between a previously stored second difference between a measurement value concerning the first detecting section and a measurement value concerning the second detecting section with the first difference between the measurement value based on the first detecting section and the measurement value based on the second detecting section, calculates a correction value for a pressure in a cooling-gas passage depending upon the first difference when the first difference is different from the second difference, and corrects the pressure value based on the pressure correction value.

Preferably, the heating device heats the substrate in the process chamber from the periphery of the substrate.

Preferably, there is comprised of a cooling-gas outlet passage communicating with the cooling-gas passage at a downstream of the cooling-gas passage, and the cooling device communicating with the cooling-gas outlet passage and cooling the substrate at a periphery edge thereof by flowing a cooling gas through the cooling-gas passage.

Preferably, there is comprised of a pressure detector for detecting an interior pressure value of the cooling-gas outlet passage communicating with the cooling-gas passage at a downstream of the cooling-gas passage, as to a cooling gas flowed through the cooling-gas passage by the cooling device.

According to the invention, a substrate processing method and semiconductor manufacturing apparatus is to be provided that the film formed on a substrate can be placed under control in respect of thickness and quality.

BRIEF DESCRIPTION OF THE DRAWINGS

FIG. 16 is a chart showing center-temperature deviation data acquired in the semiconductor manufacturing apparatus according to the third embodiment of the invention;

FIG. 19 is a chart showing the data of film thickness, etc. of a wafer processed by the semiconductor manufacturing apparatus according to the fourth embodiment of the invention;

DETAILED DESCRIPTION OF THE PREFERRED EMBODIMENTS

Basis of the Invention

Prior to describing embodiments, the basis of the present invention will now be described in order to help understand the invention.

Semiconductor Processing System 1

Figure 1:
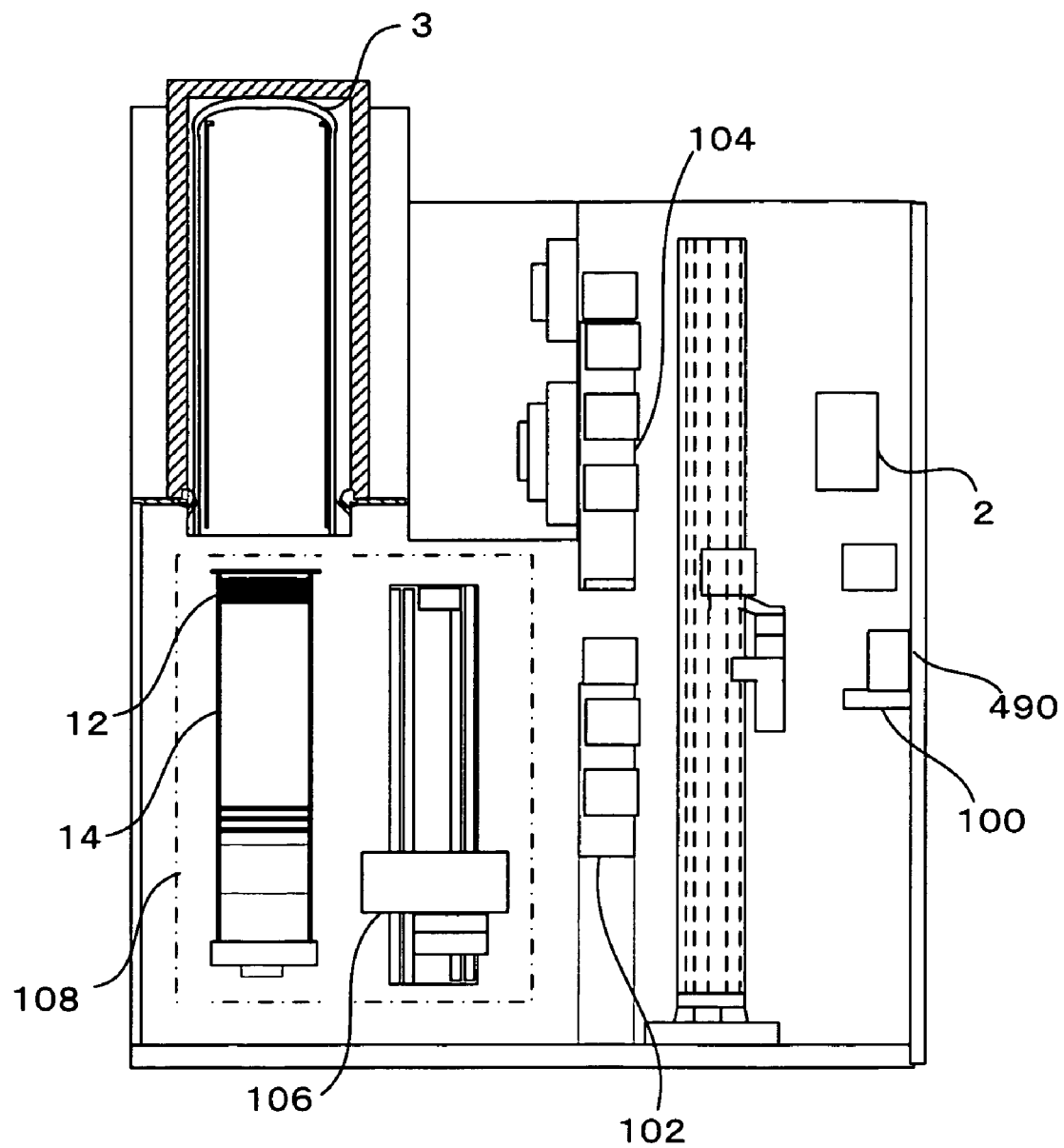
FIG. 1 is a view showing the overall construction of a semiconductor processing system constituting the basis of the present invention.

FIG. 1 shows the overall construction of semiconductor processing system 1 forming the basis of the invention.

Figure 2:
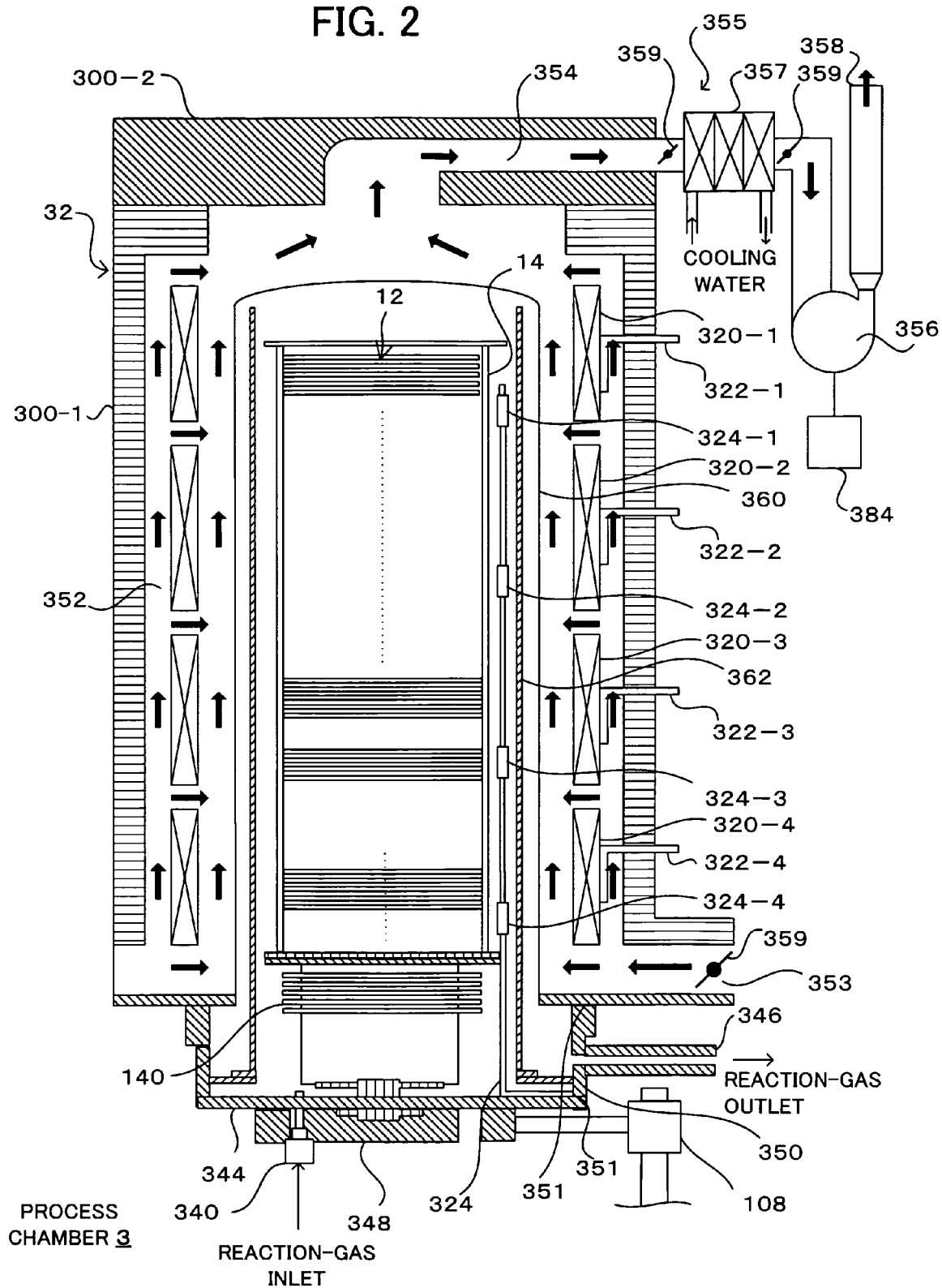
FIG. 2 is a view exemplifying a process chamber in the state that a boat and wafers shown in FIG. 1 are loaded.

FIG. 2 exemplifies process chamber 3 in the state that boat 14 and wafers 12 shown in FIG. 1 are loaded.

Figure 3:
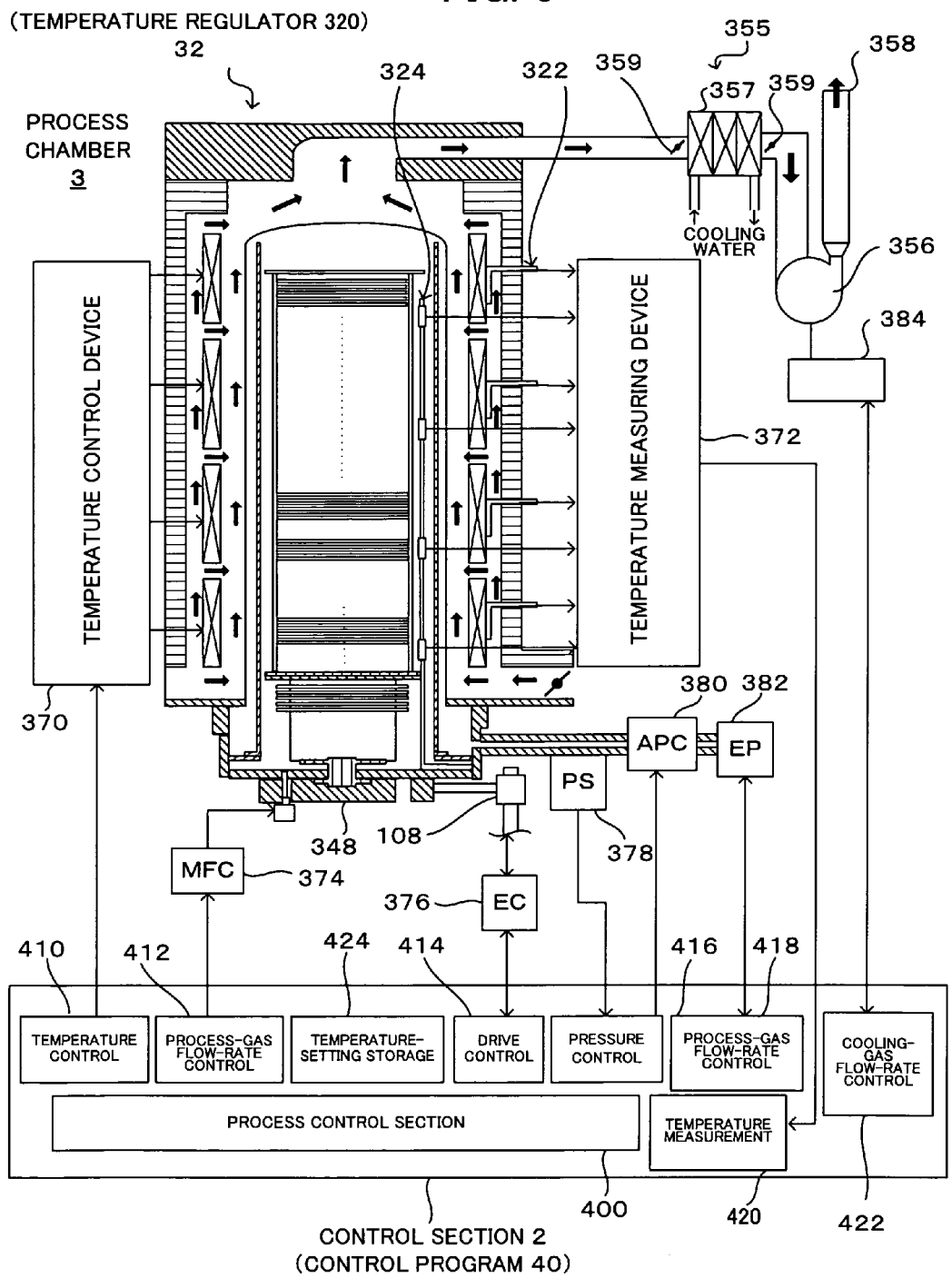
FIG. 3 is a figure showing the peripheral elements of the process chamber shown in FIG. 2 and the configuration of a first control program for controlling the process chamber.

FIG. 3 shows the peripheral components of process chamber 3 shown in FIGS. 1 and 2 and the configuration of first control program 40 for placing process chamber 3 under control.

Semiconductor processing system 1 is to be used as a semiconductor manufacturing apparatus, which is so-called a low-pressure CVD apparatus for processing a substrate, e.g. of semiconductor.

As shown in FIG. 1, semiconductor processing system 1 includes cassette delivery unit 100, cassette stocker 102 provided in back of cassette delivery unit 100, buffer cassette stocker 104 provided above cassette stocker 102, wafer transporter 106 provided in back of cassette stocker 102, boat elevator 108 provided in back of wafer transporter 106 and for transporting boat 14 loaded with wafers 12, process chamber 3 provided above wafer transporter 106 and control section 2 (control device).

Process Chamber 3

As shown in FIG. 2, process chamber 3 shown in FIG. 1 is structured with hollow heater 32 to be used as heater means, outer tube 360, inner tube 362, gas inlet nozzle 340, reactor lid 344, gas outlet pipe 346, rotary shaft 348, manifold 350 formed of stainless steel for example, O-ring 351, cooling gas passage 352, gas outlet passage 354, exhaust device 355 (discharge unit), process-gas flow-rate control device, and other components (referred later with reference to FIG. 3), thus being covered at a side portion with insulation member 300-1 and at a top portion with insulation member 300-2.

Meanwhile, a plurality of heat-insulation plates 140 are provided in the below of boat 14.

Outer tube 360 is formed, for example, of quartz transmissive of light and in a cylindrical form having an opening in a lower part thereof.

Inner tube 362 is formed, for example, of quartz transmissive of light and in a cylindrical form, thus being arranged inner of and concentric to outer tube 360.

Thus, a cylindrical space is formed between outer tube 360 and inner tube 362.

Heater 32 includes four temperature regulators (U, CU, CL, L) 320-1-320-4 with which temperature settings and adjustments are available for the respective ones. Correspondingly to external temperature sensors 322-1-322-4, e.g. thermocouples, arranged outer of outer tube 360 and to temperature regulators 320-1-320-4, there are internal temperature sensors (in-reactor TC) 324-1-324-4, such as thermocouples arranged in outer tube 360.

Internal temperature sensors 324-1-324-4 may be provided inner of inner tube 362, between inner tube 362 and outer tube 360, or bent respectively for temperature regulators 320-1-320-4 so as to detect a temperature at a center of and between wafers 12.

Temperature regulator 320-1-320-4 of heater 32 are to radiate light to heat up, for example, wafers 12 from the periphery of outer tube 360 so that wafers 12 can be raised in temperature (heated up) by the light transmitted through the outer tube 360 and absorbed in wafers 12.

Cooling-gas passage 352 is formed between insulation member 300-1 and outer tube 360 in a manner passing a fluid such as a cooling gas so that the cooling gas, supplied through intake port 353 provided at the lower end of insulation member 300-1, can be passed toward the upper of outer tube 360. The cooling gas is, for example, air or nitrogen ($N_2$).

Cooling-gas passage 352 is formed to blow a cooling gas toward outer tube 360 through between temperature regulators 320-1-320-4.

The cooling gas is to cool down outer tube 360 and the cooled outer tube 360 in turn cools down wafers 12 loaded on boat 14 from the outer periphery thereof.

Namely, by the cooling gas passing through cooling gas passage 352, outer tube 360 and wafers 12 held on boat 14 are cooled at from the outer periphery thereof.

In the above of cooling gas passage 352, gas outlet passage 354 is provided to be used as a cooling-gas outlet passage. Gas outlet passage 354 is to guide the cooling gas, supplied from intake port 353 and passed upward through the cooling gas passage 352, to the outside of heat insulation member 300-2.

Gas outlet passage 354 is provided with exhaust section 355 (exhaust device) to discharge cooling gas.

Exhaust section 355, for use as a cooling device, has cooling-gas discharge device 356, such as a blower, and radiator 357 so that the cooling gas, introduced to the outside of heat insulation member 300-2 through gas exit passage 354, can be discharged through gas outlet port 358.

Radiator 357 is to cool down the cooling gas, raised in temperature by the cooling of outer tube 360 and wafers 12 at the inside of process chamber 3, with use of a cooling water.

Incidentally, shutters 359 are respectively provided in the vicinity of intake port 353 and radiator 357 so that the opening/closure of cooling gas passage 352 and gas outlet passage 354 can be controlled by a shutter control section (shutter control device), not shown.

For process chamber 3, there are provided temperature control device 370, temperature measuring device 372, process-gas flow-rate control device (mass-flow controller: MFC) 374, boat-elevator control device (elevator controller: EC) 376, pressure sensor (PS) 378, pressure regulator device (APC: auto pressure control (valve)) 380, process-gas discharge device (EP) 382 and inverter 384, as shown in FIG. 3.

Temperature control device 370 is to drive temperature regulators 320-1-320-4, under control of control section 2 (control device).

Temperature measuring device 372 is to detect the temperatures of temperature sensors 322-1-322-4, 324-1-324-4 and output those as temperature measurement values to control section 2.

Boat-elevator control device (EC) 376 is to drive boat elevator 108, under control of control section 2.

Pressure regulator device (hereinafter, APC) 380 uses, for example, an APC or an N2 ballast control.

Meanwhile, EP 382 uses a vacuum pump, for example.

Inverter 384 is to control the rotation rate of cooling-gas discharge device 356 as a blower.

Control Section 2

Figure 4:
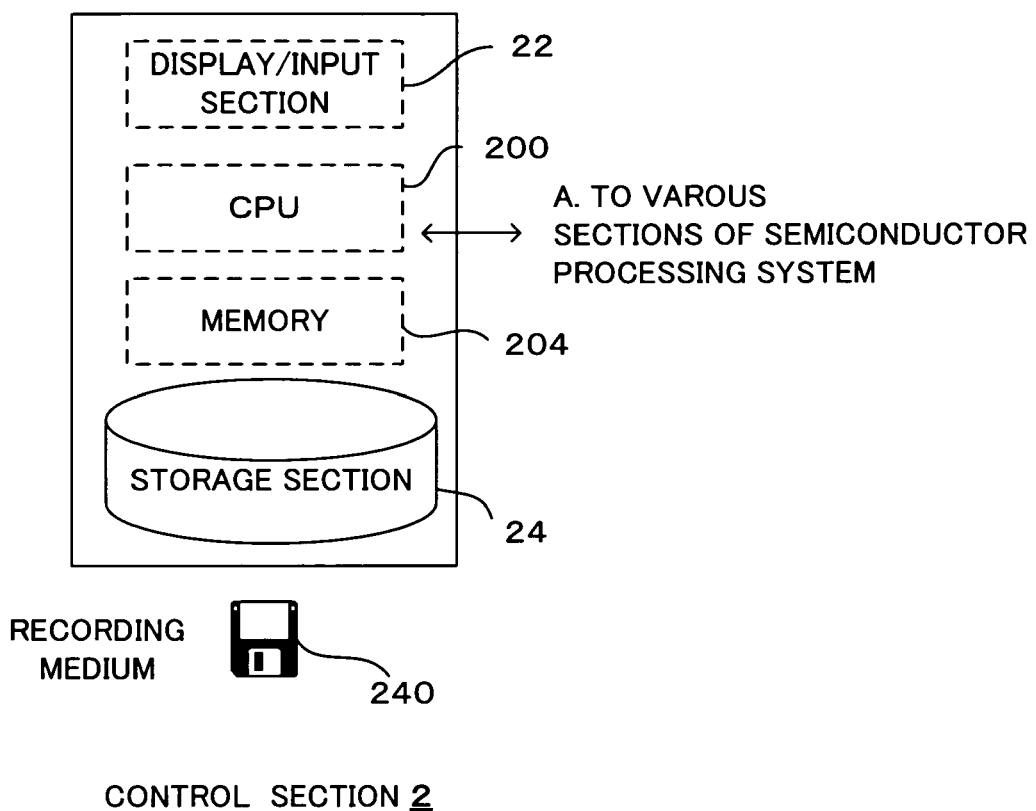
FIG. 4 is a figure showing the configuration of a control section shown in FIG. 1.

FIG. 4 shows a configuration of control section 2 shown in FIG. 1.

As shown in FIG. 4, control section 2 is configured with CPU 200, memory 204, display/input section 22 (input device) including a display device, a touch panel and a keyboard/mouse, and storage section 24 (storage device) such as an HD/CD.

Namely, control section 2 includes usual computer components capable of controlling semiconductor processing system 1.

Control section 2 is to execute a control program for low-pressure CVD processing (e.g. control program 40 shown in FIG. 3) and to control the sections of semiconductor processing system 1 by means of those components, thereby carrying out low-pressure CVD processing, described below, on wafer 12.

First Control Program 40

Reference is made again to FIG. 3.

As shown in FIG. 3, control program 40 is configured with process control section 400 (process control device), temperature control section 410 (temperature control device), process-gas flow-rate control section 412 (process-gas flow-rate control device), drive control section 414 (drive control device), pressure control section 416 (pressure control device), process-gas discharge device control section 418 (process-gas control device), temperature measuring section 420 (temperature measuring device), cooling-gas flow-rate control section 422 (cooling-gas control device) and temperature-setting storage section 424 (temperature-setting storage device).

Control program 40 is provided to control section 2, for example, through storage medium 240 (FIG. 4), and to be executed by being loaded onto memory 204.

Temperature-setting storage section 424 stores the temperature setting value as a process recipe for wafers 12, and to output it to process control section 400.

Process control section 400 is to control the components of control program 40 according to user's operation on display/input section 22 (FIG. 4) of control section 2 or to the process procedure recorded in the storage section 24 (process recipe), thereby carrying out low-pressure CVD processing of wafers 12 in a manner referred later.

Temperature measuring section 420 is to input a temperature measurement value based on temperature sensor 322, 324 through temperature measuring device 372 and output it to process control section 400.

Temperature control section 410 is to receive a temperature setting value from process control section 400 and a temperature measurement value from temperature sensor 322, 324 and to perform feedback control of the supply power to temperature regulator 320, thereby heating up the interior of outer tube 360 and bringing the wafers 12 to a desired temperature.

Process-gas flow-rate control section 412 is to control MFC 374 to regulate the flow rate of the process gas or inert gas to be supplied to the interior of outer tube 360.

Drive control section 414 is to control boat elevator 108 to raise and lower boat 14 and wafers 12 held thereon.

Drive control section 414 is to control boat elevator 108 to rotate boat 14 and wafers 12 held thereon through rotary shaft 348.

Pressure control section 416 is to receive pressure measurement value of the process gas existing in outer tube 360 based on PS 378 and to control APC 380 to bring the process gas existing in outer tube 360 into a desired pressure.

Process-gas discharge device control section 418 is to control EP 382 to discharge the process gas or inert gas from outer tube 360.

Cooling-gas flow-rate control section 422 is to control, through inverter 384, the flow rate of the cooling gas to be discharged by the cooling-gas discharge device 356.

Note that, in the ensuing description, where describing any of a plurality of constituent components such as temperature regulators 320-1-320-4, it in a certain case is merely described as temperature regulator 320.

Meanwhile, in the ensuing description, although there are cases to describe the number of constituent components such as temperature regulators 320-1-320-4, the number of constituent components is a merely exemplification for the sake of concrete, clear explanations but not intended to limit the technical scope of the invention.

O-rings 351 are disposed between the lower end of outer tube 360 and the upper opening of manifold 350 and between reactor lid 344 and the lower opening of manifold 350, thereby providing a hermetically seal between outer tube 360 and manifold 350.

Inert gas or process gas is introduced into the interior of outer tube 360 through gas-inlet nozzle 340 located in the below of outer tube 360.

In the upper part of manifold 350, gas outlet pipe 346 (FIG. 2) is attached coupled to PS 378, APC 380 and EP 382.

The process gas, flowing through between outer tube 360 and inner tube 362, is discharged to the outside through outlet pipe 346, APC 380 and EP 382.

APC 380 is to regulate the internal pressure of outer tube 360 to a previously set desired value according to the instruction from pressure control section 416, depending upon the interior-pressure measurement value of outer tube 360 based on PS 378.

Namely, APC 380 is to regulate the interior of outer tube 360 to the normal pressure according to the instruction from pressure control section 416 when introducing inert gas to the normal pressure in the interior of outer tube 360, and the interior of outer tube 360 to a desired low pressure according to the instruction from pressure control section 416 when reducing the pressure at the interior of outer tube 360 and introducing process gas for processing wafers 12.

Boat 14, holding a multiplicity of (semiconductor substrates) wafers 12, is coupled with lower rotary shaft 348 for boat 14.

Furthermore, rotary shaft 348 is coupled to boat elevator 108 (FIG. 1) so that boat elevator 108 can raise and lower boat 14 at a predetermined speed under control through EC 376.

Boat elevator 108 is to rotate wafers 12 and boat 14 at a predetermined speed through rotary shat 348.

Wafers 12, used as objects-under-processing and substrates, are conveyed in a state loaded on wafer cassette 490 (FIG. 1) to cassette delivery device 100.

Cassette delivery device 100 is to transfer wafers 12 to cassette stocker 102 or buffer cassette stocker 104.

Wafer transporter 106 is to take wafers 12 out of cassette stocker 102 and load those in a horizontal stack state in boat 14.

Boat elevator 108 raises boat 14, on which wafers 12 are loaded, and introduces those into process chamber 3.

Meanwhile, boat elevator 108 is to lower boats 14, on which processed wafers 12 are loaded, and to take those out of process chamber 3.

Temperature of and Film Thickness on Wafer 12

Figure 5:
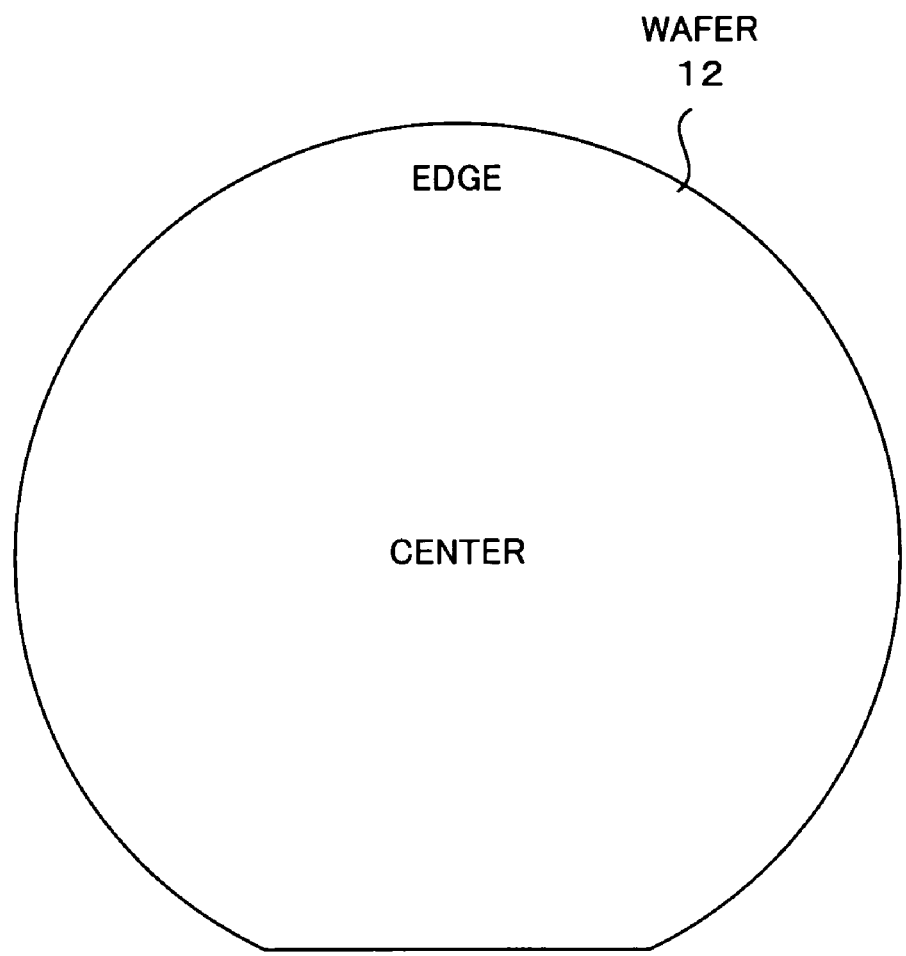
FIG. 5 is a figure exemplifying the shape of a wafer to be processed in the semiconductor processing system.

FIG. 5 exemplifies the shape of wafer 12 to be processed in semiconductor processing system 1 (FIG. 1).

Wafer, whose surface (hereinafter, the surface of wafer 12 is also described merely as wafer 12) is in such a form as shown in FIG. 5, is held horizontal on boat 14.

Wafer 12 is heated up from the periphery of outer tube 360 by the light, radiated by temperature regulators 320-1-320-4 and transmitted through outer tube 360.

Accordingly, wafer 12 absorbs the greater amount of light at its edge. In the case no cooling gas flows through cooling-gas passage 352, temperature is higher at the edge than at the center on the surface of wafer 12. Namely, a cone-shaped temperature distribution occurs on wafer 12 in a portion between the edge and the center of wafer 12 wherein temperature is higher as the outer periphery of wafer 12 is neared and lower as the center thereof is neared.

Meanwhile, as for a process gas such as a reactive gas, reaction rate possibly differs at the edge and at the center of wafer 12 depending upon the type of a film formed on wafer 12 because of being supplied from outer peripheral side of wafer 12.

For example, because a process gas such as a reactive gas is to reach the center of wafer 12 after being consumed at the edge of wafer 12, the concentration of the process gas is lower at the center of wafer 12 as compared to the edge thereof.

For this reason, assuming that no temperature deviation occurs at between the edge and the center of wafer 12, the film formed on wafer 12 becomes possibly non-uniform in thickness at the edge and at the center resulting from the supply of reactive gas from the outer peripheral side of wafer 12.

Meanwhile, by passing a cooling gas through cooling-gas passage 352, outer tube 360 and wafers 12 set up on boat 14 are cooled down from the outer periphery. Namely, process chamber 3 heats up wafer 12 at its center to a predetermined setting temperature (process temperature) by means of temperature regulator 320. By passing a cooling gas through cooling-gas passage 352 and cooling down wafer 12 at its outer periphery as required, temperature can be established differently on wafer 12 at the center and at the edge thereof.

In order to form a film uniform on wafer 12 in this manner, heat-up control (control involving heating and cooling) is effected to regulate the film thickness in accordance with the reaction rate in forming a film on wafer 12. Heat-up control is to be effected by at least one of controlling temperature regulator 320 of heater 32 by control section 2 through use of the measurement value of internal temperature sensor 324 and controlling cooling-gas discharge device 356 through cooling-gas flow-rate control section 422 and inverter 384 by control section 2.

Outline of Low-Pressure CVD Process Based on Semiconductor Processing System

Semiconductor processing system 1 is to form an $Si_3O_4$ film, an $SiO_2$ film, a polysilicon (poly-Si) film or the like by CVD on semiconductor wafers 12 arranged at a predetermined interval within process chamber 3, under control of control program 40 (FIG. 3) executed on control section 2 (FIGS. 1 and 4).

Description is further made on the forming of a film by the use of process chamber 3.

At first, boat elevator 108 moves boat 14 downward.

A desired number of wafers 12 to be processed are loaded onto boat 14 lowered. Boat 14 holds thereon wafers 12 thus loaded.

Then, four temperature regulators 320-1-320-4 of heater 32 heat up the interior of outer tube 360 according to the setting thereof. Wafers 12 are each heated up at the center to a previously set constant temperature.

Meanwhile, cooling gas flows through cooling-gas passage 352 in accordance with the setting, to cool outer tube 360 and wafers 12 held on boat 14 from the outer peripheral side.

Then, MFC 374 regulates the flow rate of a gas to introduce and charges an inert gas into outer tube 360 by adjusting gas inlet nozzle 340 (FIG. 2).

Boat elevator 108 moves boat 14 upward into outer tube 360 in the state filled with an inert gas at a desired process temperature.

Then, the inert gas in outer tube 360 is discharged by EP 382, to place the interior of outer tube 360 in a vacuum state. Boat 14 and wafers 12 held thereon are rotated about rotary shaft 348.

In this state, when a process gas is introduced into outer tube 360 through gas inlet nozzle 340, the introduced process gas moves up the interior of outer tube 360, thus being supplied evenly over to wafers 12.

EP 382 discharges the process gas from outer tube 360 under low-pressure CVD process through gas outlet pipe 346. APC 380 brings the process gas present in outer tube 360 into a desired pressure.

As described above, low-pressure CVD process is carried out on wafers 12 for a predetermined time.

When the low-pressure CVD process completes, the process gas in outer tube 360 is replaced with an inert gas whose pressure is regulated to the normal pressure in order for transition into a process for the next wafer 12.

Furthermore, the cooling gas flows through cooling-gas passage 352, to cool the interior of outer tube 360 down to a predetermined temperature.

In this state, boat 14 and processed wafers 12 held thereon are moved down by boat elevator 108 and taken out of outer tube 360.

Boat elevator 108 raises boat 14 holding thereon wafers 14 to be next subjected to a low-pressure CVD process and loads those into outer tube 360.

The next low-pressure CVD process is executed on wafers 12 thus loaded.

Incidentally, film thickness can be controlled by passing a cooling gas in the duration from before a start of processing up to a termination of processing of wafers 12. However, the cooling gas is preferably passed also in the case that boat 14 held with wafers 12 is moved into outer tube 360 and in the case that boat 14 is taken out of outer tube 360.

This prevents heat from being confined in process chamber 3 due to the thermal capacity of process chamber 3 thereby varying the temperature and improving the throughput.

In the above film-forming process, by controlling heater 32 in a manner providing a temperature difference at between the end (peripheral edge) and the center of wafer 12 with use of a cooling gas while controlling the center of wafer 12 in a manner kept at a constant temperature in accordance with the setting, wafers 12 can be improved in the uniformity of in-plane film thickness and plane-to-plane film thickness without changing the film quality. For example, where forming a CVD film such as an $Si_3N_4$ film, if a film is formed at varying process temperature, the resulting film has a refractive index changing with process temperature. If a film is formed at decreasing process temperature from high to low temperature, the resulting film has an etch rate changing depending upon process temperature.

Meanwhile, if an $Si_3N_4$ is formed at a reducing process temperature from high to low temperature, the resulting film has a stress value depending upon process temperature.

Therefore, in semiconductor processing system 1, control section 2 is to control the temperature based on temperature regulator 320 and the flow rate of the cooling gas passing through cooling-gas passage 352, thereby controlling the temperature of outer tube 360 and the in-plane temperature of the substrates such as wafers 12. Due to this, the film formed on the substrate can be controlled in thickness uniformity while preventing the quality thereof from changing.

Gas Discharge Pressure and Film Thickness

As described above, when forming a film by means of semiconductor processing system 1, heat-up control is performed by at least one of controlling by control section 2 on the temperature regulator 320 of heater 32 with use of the measurement value of internal sensor 324 and controlling by control section 2 on the cooling-gas discharge device 356 through cooling-gas flow-rate control section 422 and inverter 384. When passing a cooling gas through cooling-gas passage 352, the cooling gas passes through cooling-gas passage 352 and gas outlet passage 354, thus being discharged by exhaust device 355 through the gas outlet port 358. Gas outlet port 358 is connected to an exhaust equipment such as of a factory, not shown. The gas exhaust equipment draws the cooling gas through gas outlet passage 354 at an equipment-based discharge pressure thereby discharging the gas through gas outlet passage 354.

The equipment-based discharge pressure differs from exhaust equipment to exhaust equipment and possibly varies even within the same exhaust equipment because of being affected by the conductance resulting from the distance, form and route of the piping from the exhaust equipment to gas outlet port 358 or the effect of the number of devices connected to the exhaust equipment of the factory.

Where the equipment's pressure changes, the gas flowing through cooling-gas passage 352 changes in quantity even if cooling gas is supplied in the same amount.

For example, assuming that equipment-based discharge pressure changes from 200 Pa to 150 Pa, the flow rate of the cooling gas flowing through cooling-gas passage 352 is reduced by the effect of varying equipment-based discharge pressure.

Meanwhile, assuming that equipment-based discharge pressure changes from 150 Pa to 200 Pa, the flow rate of the cooling gas flowing through cooling-gas passage 352 is increased by the effect of varying equipment-based discharge pressure.

In this manner, where the flow rate of the cooling gas flowing through cooling-gas passage 352 changes with the change of equipment pressure, the cooling capability based on cooling gas flow is affected. For example, even in case temperature control and cooling-gas flow rate control are made based on measurement values by internal temperature sensor 324 such that a predetermined setting temperature (process temperature) is attained at the center of wafer 12 while a lower temperature than the process temperature is at the edge of wafer 12, the cooling capability from outer periphery changes at outer tube 360 and wafers 12 held on boat 14.

Where the cooling capability from outer periphery changes, there is a possibility to raise a problem that temperature is higher than the process temperature, for example, at the edge of wafer 12 thus making it impossible to reproduce the film thickness over the surface of wafer 12.

In this manner, in semiconductor processing system 1 to which the invention is applied, the reproducibility of film thickness is available well on wafer 12 where equipment-based discharge pressure is kept constant. However, where equipment-based discharge pressure is not constant, the reproducibility of film thickness is not available on wafer 12 thus making it impossible to provide a film thickness uniform.

Therefore, the invention is devised uniquely to provide a film thickness uniform over wafer 12 even if there is a variation or change in equipment-based discharge pressure.

Figure 6:
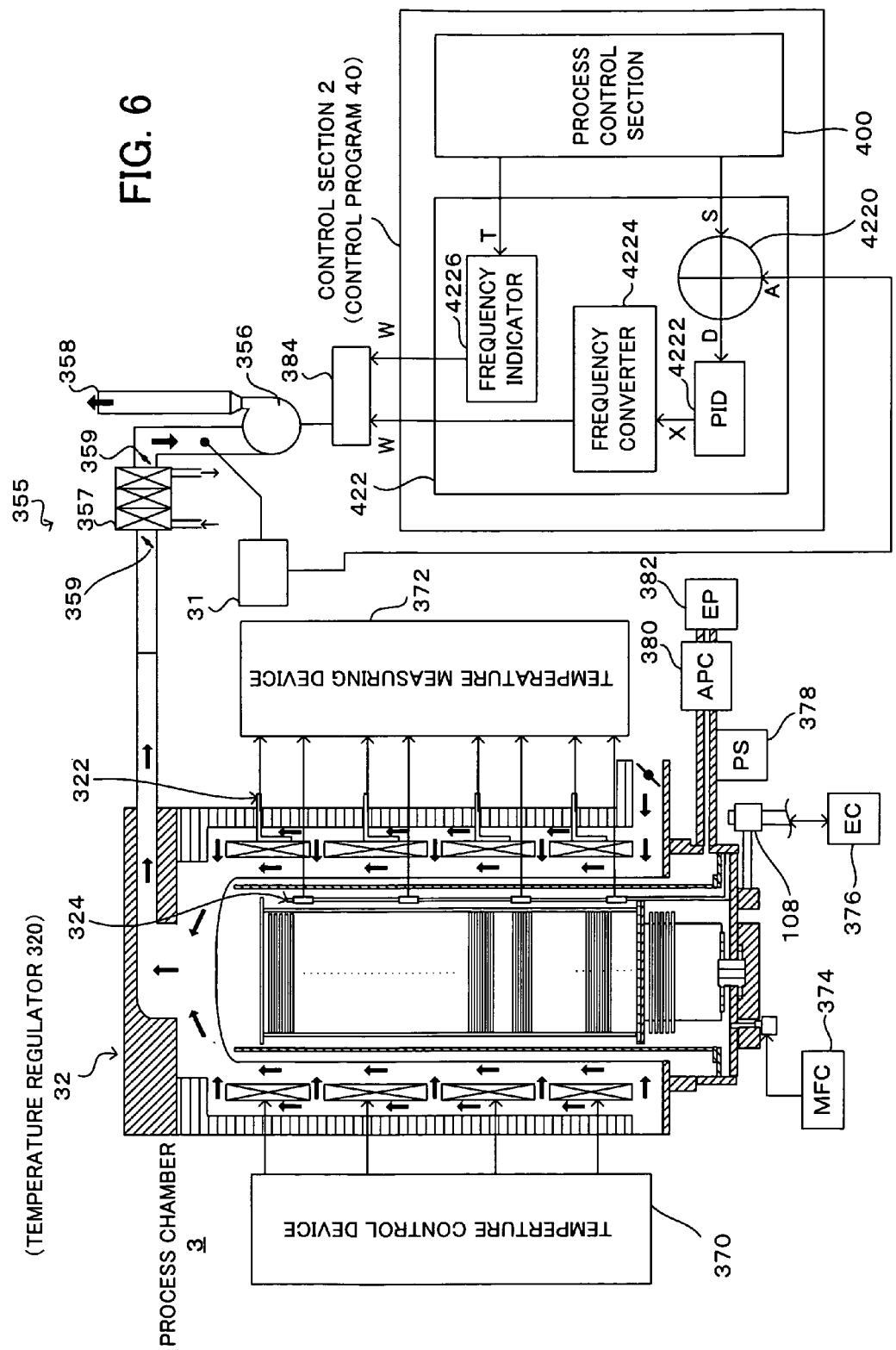
FIG. 6 is a diagram showing the arrangement of a semiconductor processing system according to a first embodiment of the invention.

FIG. 6 shows a construction of semiconductor processing system 1 according to a first embodiment of the invention.

Semiconductor processing system 1 in the first embodiment of the invention has a unique structure to provide wafer with a film uniform in thickness even where there is a variation or change in equipment-based discharge pressure, in addition to the structure possessed by semiconductor processing system 1 shown in FIGS. 1 to 4 to which the invention is applied.

As shown in FIG. 6, semiconductor processing system 1 is provided with pressure sensor 31, for detecting the internal pressure of the piping connecting between cooling-gas discharge device 356 and radiator 357 on the pipe of exhaust device 355. Pressure sensor 31 is desirably provided in a position possibly closest to radiator 357, on the piping connecting between cooling-gas discharge device 356 and radiator 357. This is because, by providing radiator 357 possibly closest to radiator 357, pressure loss can be prevented from occurring in the cooling gas flowing from radiator 357 to pressure sensor 31 under the influence of piping length, route, form and so on.

Control program 40 is configured with process control section 400 (process control device), temperature control section 410 (temperature control device), process-gas flow-rate control section 412 (process-gas flow-rate control device), drive control section 414 (drive control device), pressure control section 416 (pressure control device), process-gas discharge device control section 418 (process-gas discharge device control device), temperature measuring section 420 (temperature measuring device), cooling-gas flow-rate control section 422 (cooling-gas control device) and temperature-setting storage section 424 (temperature-setting storage device), similarly to the foregoing semiconductor processing system 1 forming the basis of the invention.

In FIG. 6, there are shown process control section 400 and cooling-gas flow-rate control section 422 while omitting the showing of temperature control section 410, process-gas flow-rate control section 412, drive control section 414, pressure control section 416, process-gas discharge device control section 418, temperature measuring section 420 and temperature-setting storage section 424.

The control program is to be provided to control section 2 through recording medium 240 (FIG. 4) and executed by being loaded onto memory 240, similarly to the foregoing semiconductor processing system 1 forming the basis of the invention.

Cooling-gas flow-rate control section 422 is structured with subtracter 4220, PID operator 4222, frequency converter 4224 and frequency indicator 4226.

A pressure target value S is inputted from process control section 400 to subtracter 4220.

Here, the pressure target value "S" is previously determined to bring wafer 12 to a predetermined setting temperature (process temperature) at the center thereof and to a temperature lower than the process temperature at the edge thereof. For example, it can use a temperature correction value for internal temperature sensor 324 stored in temperature-setting storage section 424 and a pressure value corresponding to the temperature correction value.

In addition to the pressure target value "S", a pressure value "A" measured by pressure sensor 31 is inputted to subtracter 4220. Subtracter 4220 outputs a difference "D" the pressure value "A" is subtracted from the pressure target value "S".

The difference "D" is inputted to PID operator 4222. PID operator 4222 performs PID operation based on the inputted difference "D" thereby calculating an operation amount X. The calculated operation amount "X" is inputted to frequency converter 4224 where frequency converter 4224 converts it into a frequency W and outputs the same.

The outputted frequency "W" is inputted to inverter 384, to change the frequency for cooling-gas discharge device 356.

The pressure value "A" from pressure sensor 31 is inputted to subtracter 4220 at all times or at a predetermined time interval. Based on the pressure value "A", frequency control is continued for cooling-gas discharge device 356 in a manner bringing the difference "D" between a pressure target value "S" and a pressure value "A" into 0.

As described above, the frequency for cooling-gas discharge device 356 is controlled through inverter 384 in a manner eliminating the difference "D" between a pressure value "A" measured by pressure sensor 31 and a pressure target value "S" previously defined. Namely, the frequency controlled in a manner eliminating the difference "D" is feedback-controlled with the frequency at which the difference is 0, so that cooling-gas flow-rate control section 422 can control the flow rate of cooling gas depending upon the fed-back value.

In place of operating the frequency "W" at PID operator 4222, process control section 400 may input a frequency setting value T to frequency indicator 4226 and frequency indicator 4226 input the frequency "W" to inverter 384, thereby changing the frequency for cooling-gas discharge device 356.

Under control as above, the film formed on wafer 12 can be prevented from varying in thickness due to the variation in the flow rate of the cooling medium flowing through cooling-gas passage 352 even where there is variation or change in the equipment-based discharge pressure connected to gas outlet port 358.

Figure 7:
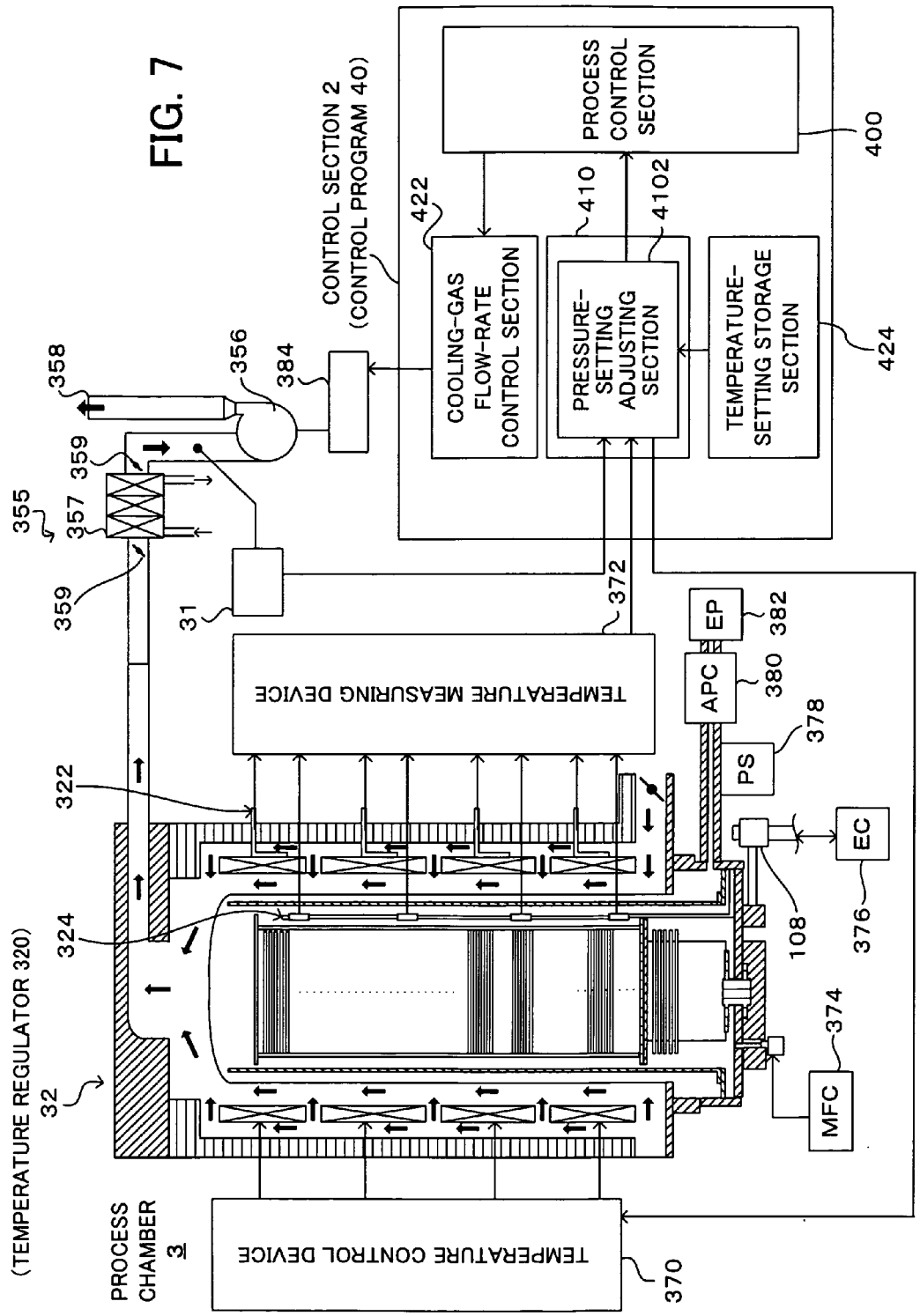
FIG. 7 is a diagram showing the arrangement of a semiconductor processing system according to a second embodiment of the invention.

FIG. 7 shows a construction of semiconductor processing system 1 according to a second embodiment of the invention.

In the foregoing semiconductor processing system 1 of the first embodiment, control section 2 was to control cooling-gas discharge device 356 depending upon the pressure value detected by pressure sensor 31 used as a pressure detector. On the contrary, in semiconductor processing system 1 of the second embodiment, control section 2 is to control cooling-gas discharge device 356 and heater 32, used as a heating device, depending upon the pressure value detected by pressure sensor 31.

Control program 40 (control device) for use in the second embodiment is configured with process control section 400 (process control device), temperature control section 410 (temperature control device), process-gas flow-rate control section 412 (process-gas flow-rate control device), drive control section 414 (drive control device), pressure control section 416 (pressure control device), process-gas discharge device control section 418 (process-gas discharge device control device), temperature measuring section 420 (temperature measuring device), cooling-gas flow-rate control section 422 (cooling-gas control device) and temperature-setting storage section 424 (temperature-setting storage device).

In FIG. 7, there are shown process control section 400, temperature control section 410, cooling-gas flow-rate control section 422 and temperature-setting storage section 424 wherein omitted is the showing of showing process-gas flow-rate control section 412, drive control section 414, pressure control section 416, process-gas discharge device control section 418 and temperature measuring section 420. The control program is to be provided to control section 2 through recording medium 240 (FIG. 4) and executed by being loaded onto memory 240, similarly to the foregoing semiconductor processing system 1 forming the basis of the invention.

Temperature control section 410 has pressure-setting adjusting section 4102 (pressure-setting adjusting device). Pressure-setting adjusting section 4102 calculates and establishes a desired temperature distribution over wafer 12 by use of correlation table, etc., between a film thickness and a temperature distribution, previously stored in temperature-setting storage section 424.

Pressure-setting adjusting section 4102 compares between the temperature measured by temperature measuring instrument 372 and the temperature distribution registered in temperature-setting storage section 424, and calculates a pressure setting value in a position upstream of cooling-gas discharge device 356 in order to provide wafer 12 with a temperature distribution established. The pressure setting value is instructed to cooling-gas flow-rate control section 422 through process control section 400. Here, in place of instructing a pressure value from pressure-setting adjusting section 4102 to cooling-gas flow-rate control section 422 through process control section 400, the pressure setting value may be instructed directly from pressure-setting adjusting section 4102 to cooling-gas flow-rate control section 422.

Cooling-gas discharge device 356 is controlled to a setting value of temperature distribution, according to the instruction from pressure-setting adjusting section 4102. For example, PID operation is used similarly to the first embodiment. By establishing a PID constant, temperature control is realized with promptness and stability while suppressing against excessive temperature variation.

Meanwhile, temperature control section 410 including pressure-setting adjusting section 4102 controls the pressure in a position upstream of cooling-gas discharge device 356 by instructing a pressure setting value to cooling-gas discharge device 356. It also controls heater 32 through temperature control device 370 depending upon the temperature measured by temperature measuring instrument 372 and the temperature distribution established by pressure-setting adjusting section 4102.

Figure 8:
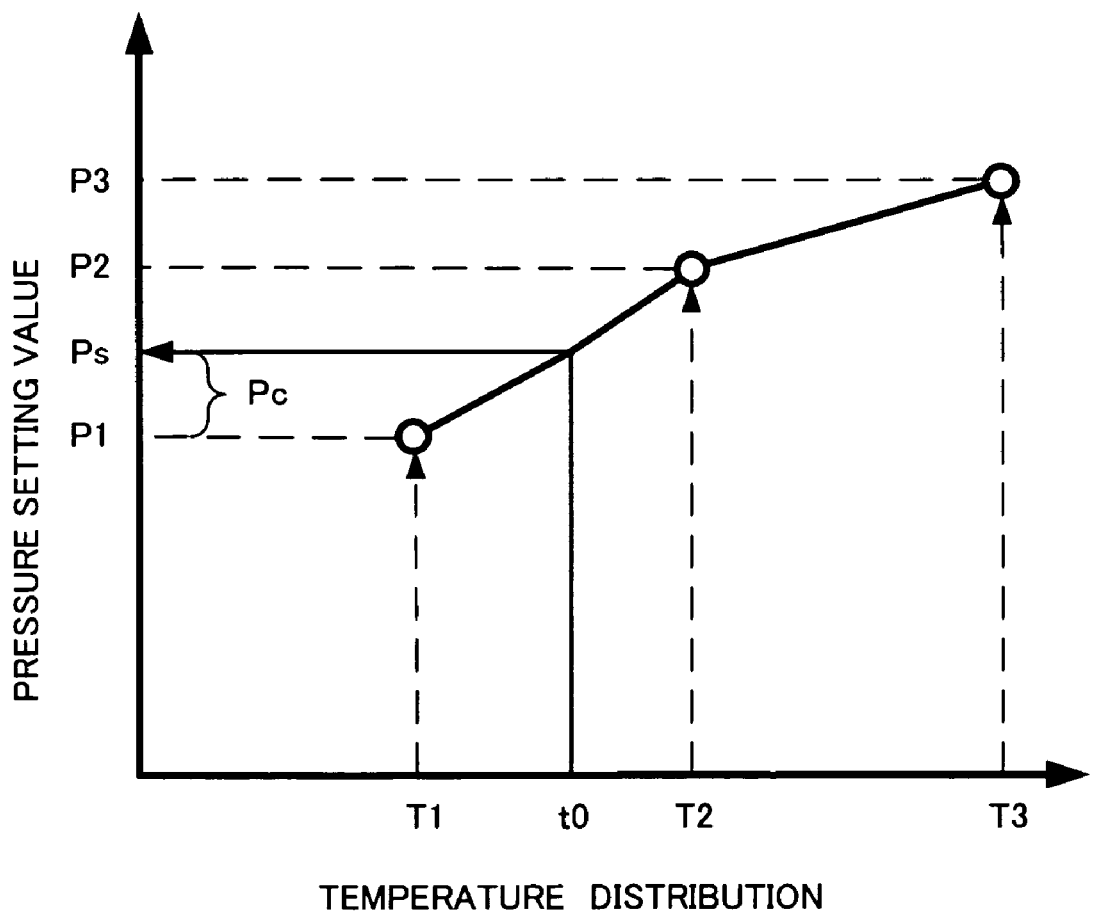
FIG. 8 is a figure explaining an example of operating a pressure setting value for the semiconductor processing system according to a second embodiment of the invention.

FIG. 8 illustrates an example of the operation of a pressure setting value due to pressure-setting adjusting section 4102.

Prior to operation, the pressure setting values corresponding to temperature distributions on wafers 12 are previously registered, for example, in temperature-setting storage section 424, to previously acquire and input the correlation table data between a pressure setting value and a temperature distribution value. Input may be made simultaneously with acquiring the correlation table data between a film thickness and a temperature distribution.

In operation, a certain pressure set value is instructed to cooling-gas discharge device 356. In this case, when the temperature distribution value on wafer 12 is different from the temperature distribution value previously registered, a correction value is calculated for the pressure setting value on the basis of the correlation table data between a pressure setting value and a temperature distribution registered value, the result of which is instructed to cooling-gas flow-rate control section 422.

Specifically, assuming that there are registered a pressure registered value P1 at a temperature distribution registered value T1, a pressure registered value P2 at a temperature distribution registered value T2 and a pressure registered value P3 at a temperature distribution registered value T3 as to temperature distribution registered values in a relationship T1<T2<T3 as shown in FIG. 8, provided that the pressure setting value currently instructed is Ps and the temperature distribution on wafer 12 at that time is t0, the correction amount Pc for the pressure correction value is to be determined by the following (equation 2) when t0 lies in a range shown in the following (equation 1).

$$T1 < T0 < T2 \quad \text{(equation 1)}$$

$$Pc = \{(P2-P1)/(T2-T1)\} \times (t0-T1) \quad \text{(equation 2)}$$

Meanwhile, the correction amount Pc is determined by the following (equation 4) when t0 lies in a range shown in the following (equation 3), by the following (equation 6) when t0 lies in a range shown in the following (equation 5) and by the following (equation 8) when t0 lies in a range shown in the following (equation 7).

$$t0 < T1 \quad \text{(equation 3)}$$

$$Pc = \{(P2-P1)/(T2-T1)\} \times (T1-t0) \quad \text{(equation 4)}$$

$$T3 < t0 \quad \text{(equation 5)}$$

$$Pc = \{(P3-P2)/(T3-T2)\} \times (t0-T3) \quad \text{(equation 6)}$$

$$T2 < t0 < T3 \quad \text{(equation 7)}$$

$$Pc = \{(P3-P2)/(T3-T2)\} \times (t0-T2) \quad \text{(equation 8)}$$

As described above, in semiconductor processing system 1 according to the second embodiment, control is made not only on cooling-gas discharge device 356 but also on heater 32 depending upon the pressure value detected by pressure sensor 31. Note that, as for the same elements to those of the first embodiment, the same reference numerals are attached in FIG. 7 thereby omitting the explanations.

In the foregoing semiconductor processing system 1 of the first embodiment, control section 2 was to control cooling-gas discharge device 356 depending upon the pressure value detected by pressure sensor 31 used as a pressure detector. In the foregoing semiconductor processing system 1 of the second embodiment, control section 2 is to control cooling-gas discharge device 356 and heater 32 depending upon the pressure value detected by pressure sensor 31. However, control section 2 satisfactorily controls at least one of cooling-gas discharge device 356 and heater 32 depending upon the pressure value detected by pressure sensor 31.

While referring to FIGS. 9 to 13, description is now made on a third embodiment of the invention.

Figure 9:
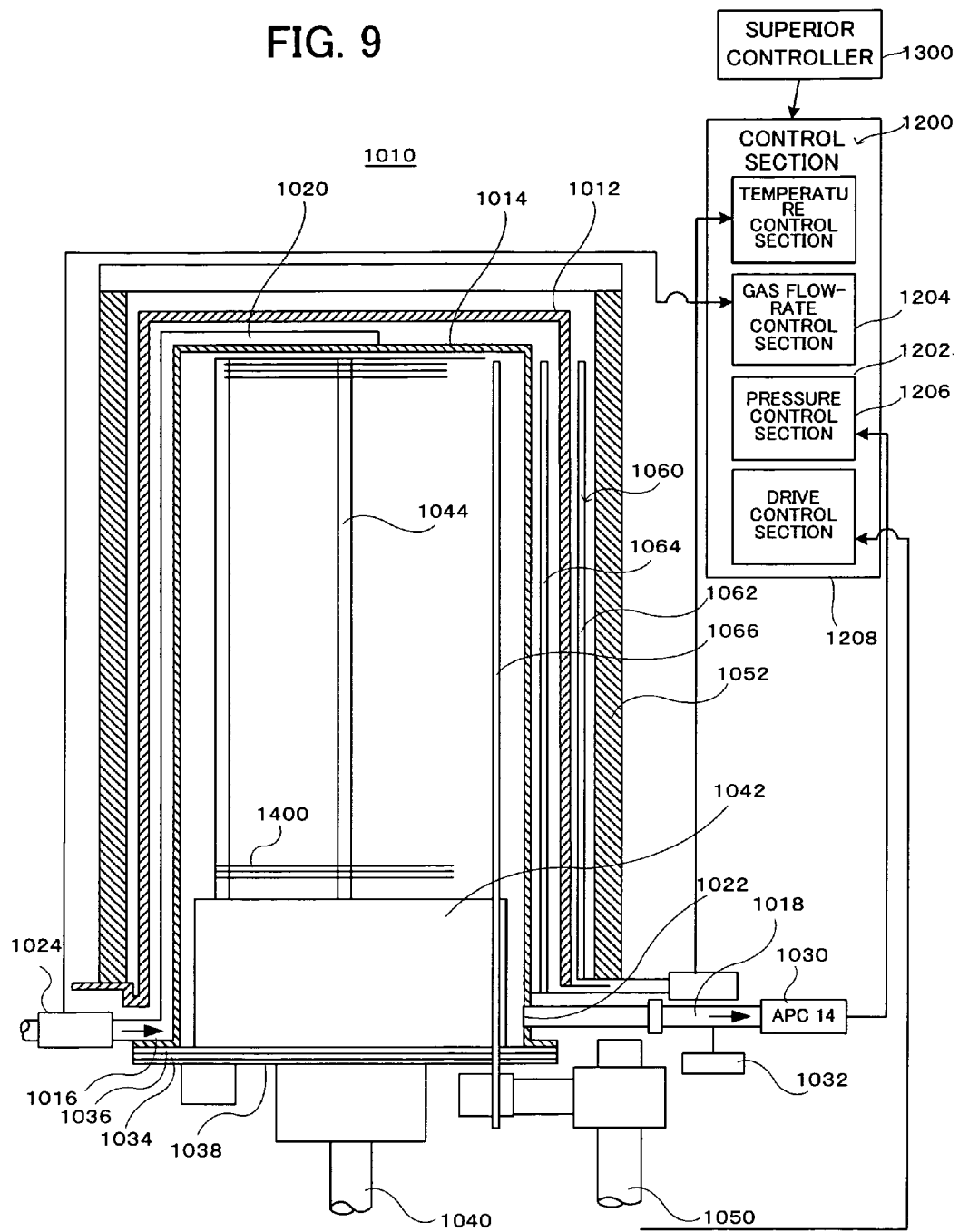
FIG. 9 is a diagram typically showing the arrangement of a semiconductor manufacturing apparatus according to a third embodiment of the invention.

FIG. 9 typically shows the construction of semiconductor manufacturing apparatus 1010 according to a third embodiment of the invention.

Semiconductor manufacturing apparatus 1010 has a soaking tube 1012. Soaking tube 1012 is formed of a heat-resisting material, e.g. SiC, and in a cylindrical form closed at the upper end and having an opening at the lower end. In the inner of soaking tube 1012, reactor tube 1014 is provided to be used as a reactor vessel. Reactor tube 1014 is formed of a heat-resisting material, e.g. quartz ($SiO_2$), and in a cylindrical form having an opening at the lower end, to be arranged within and concentric to soaking tube 1012.

Reactor tube 1014 is coupled, at its lower portion, with gas supply pipe 1016 and gas outlet pipe 1018 that are formed of quartz, for example. Supply pipe 1016 is provided, in a coupling manner, with introducing member 1020 formed with an inlet port for introducing a gas into the reactor tube. Supply pipe 1016 and introducing member 1020 extend in a manner rising in a thin tube form along the side portion of reactor tube 1014 from the lower part of reactor tube 1024 and reaching the interior of reactor tube 1014 at a ceiling of reactor tube 1014.

Meanwhile, gas outlet pipe 1018 is connected to gas outlet port 1022 formed in reactor tube 1014.

Supply pipe 1016 is used to flow a gas to the interior of reactor tube 1014 through the ceiling of reactor tube 1014 while gas outlet pipe 1018 connected to the lower part of reactor tube 1014 is to discharge the gas through the lower part of reactor tube 1014. In reactor tube 1014, a process gas for use in the reactor tube 1014 is supplied through introducing member 1020 and supply pipe 1016. Meanwhile, gas supply pipe 1016 is connected with MFC (mass flow controller) 1024 to be used as flow-rate control means for controlling the flow rate of a gas or with a moisture generator, not shown. MFC 1024 is connected to gas flow-rate control section 1202 (gas flow-rate control device) possessed by control section 1200 (control device) so that the gas or water vapor ($H_2O$) to supply can be controlled at a predetermined amount by gas flow-rate control section 1202.

Control section 1200 has temperature control section 1204 (temperature control device), pressure control section 1206 (pressure control device) and drive control section 1208 (drive control device), in addition to the foregoing gas flow-rate control section 1202. Meanwhile, control section 1200 is connected to and controlled by superior controller 1300.

On gas outlet pipe 1018, there are attached APC 1030 to be used as a pressure regulator and pressure sensor 1032 to be used as pressure detecting means. APC 1030 is to control the flow rate of a gas exiting from reactor tube 1014 depending upon the pressure detected by pressure sensor 1032 so that the interior of reactor tube 1014 can be controlled to a constant pressure, for example.

At the opening formed in the lower end of reactor tube 1014, base 1034 is attached through O-ring 1036 which is formed of quartz for example, having a disk form for example and to be used as a support. Base 1034 is removably attached on reactor tube 1014, to hermetically seal reactor tube 1014 in an attached state to reactor tube 1014. Base 1034 is attached on seal cap 1038 formed nearly in a disk form, at its upper surface with respect to a gravity direction.

Seal cap 1038 is coupled with rotary shaft 1040 used as rotating means. Rotary shaft 1040 is rotated by the drive from a not-shown drive source, to rotate quartz cap 1042 used as a support, boat 1044 used as a substrate support member and wafers 1400 as substrates held on boat 1044. The rotation rate of rotary shaft 1040 is under control of control section 1200.

Meanwhile, semiconductor manufacturing apparatus 1010 has boat elevator 1050, for use in vertically moving boat 1044, to be placed under control of control section 1200.

Heater 1052, to be used as heating means, is arranged around and concentrically to reactor tube 1014. Heater 1052 is under control of temperature control section 1204 in a manner to bring the interior temperature of reactor tube 1014 to a process temperature established by superior controller 1300, depending upon the temperature detected by temperature detector 1060 (temperature detecting device) provided in first, second and third thermocouples 1062, 1064, 1066.

First thermocouple 1062 is used to detect the temperature of heater 1052 while second thermocouple 1064 is to detect the temperature in a position between soaking tube 1012 and reactor tube 1014. Here, second thermocouple 1064 may be arranged between reactor tube 1014 and boat 1044, to detect the interior temperature of reactor tube 1014.

Third thermocouple 1066 is arranged between reactor tube 1014 and boat 1044, i.e. in a position closer to boat 1044 than second thermocouple 1064, to detect a temperature in a position closer to boat 1044. Third thermocouple 1066 is used to measure the uniformity of interior temperature of reactor tube 1014 in a stabilized duration of temperature.

Figure 10:
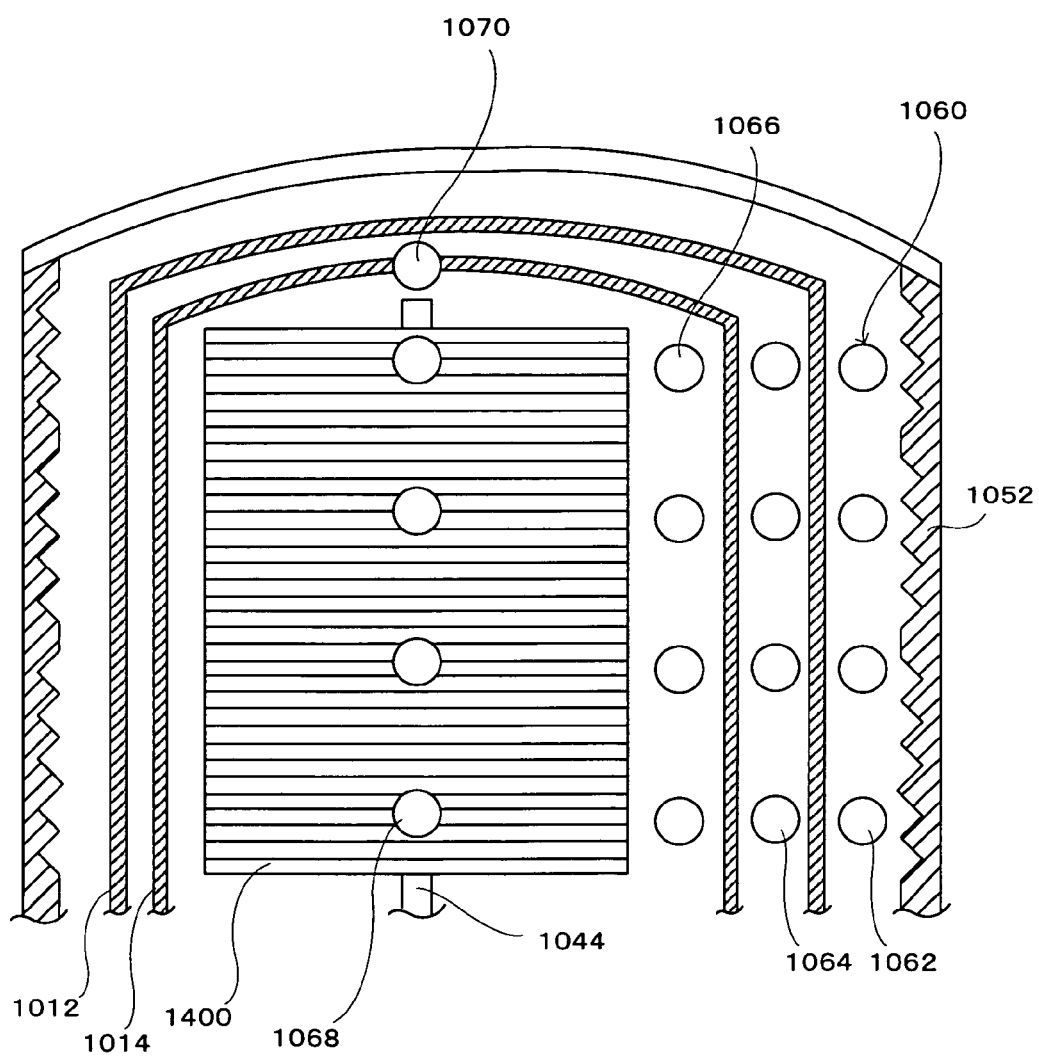
FIG. 10 is a view typically showing the arrangement of a reactor tube possessed by the semiconductor manufacturing apparatus according to the third embodiment of the invention.

FIG. 10 typically shows a peripheral structure of reactor tube 1014.

Semiconductor manufacturing apparatus 1010 has temperature detector 1060 as noted before while temperature detector 1060 is provided with first thermocouple 1062, second thermocouple 1064 and third thermocouple 1066. In addition to those, temperature detector 1060 has center thermocouple 1068 as shown in FIG. 10 that detects the temperature of wafers 1400 nearly at the center thereof and ceiling thermocouple 1070 that detects the temperature of boat 1044 in a position close to the ceiling. Semiconductor manufacturing apparatus 1010 may be provided with lower thermocouple 1072 (see FIG. 13), referred later.

Incidentally, third thermocouple 1066 may be omitted because center thermocouple 1068 can have a function as an alternative to third thermocouple 1066.

Figure 11:
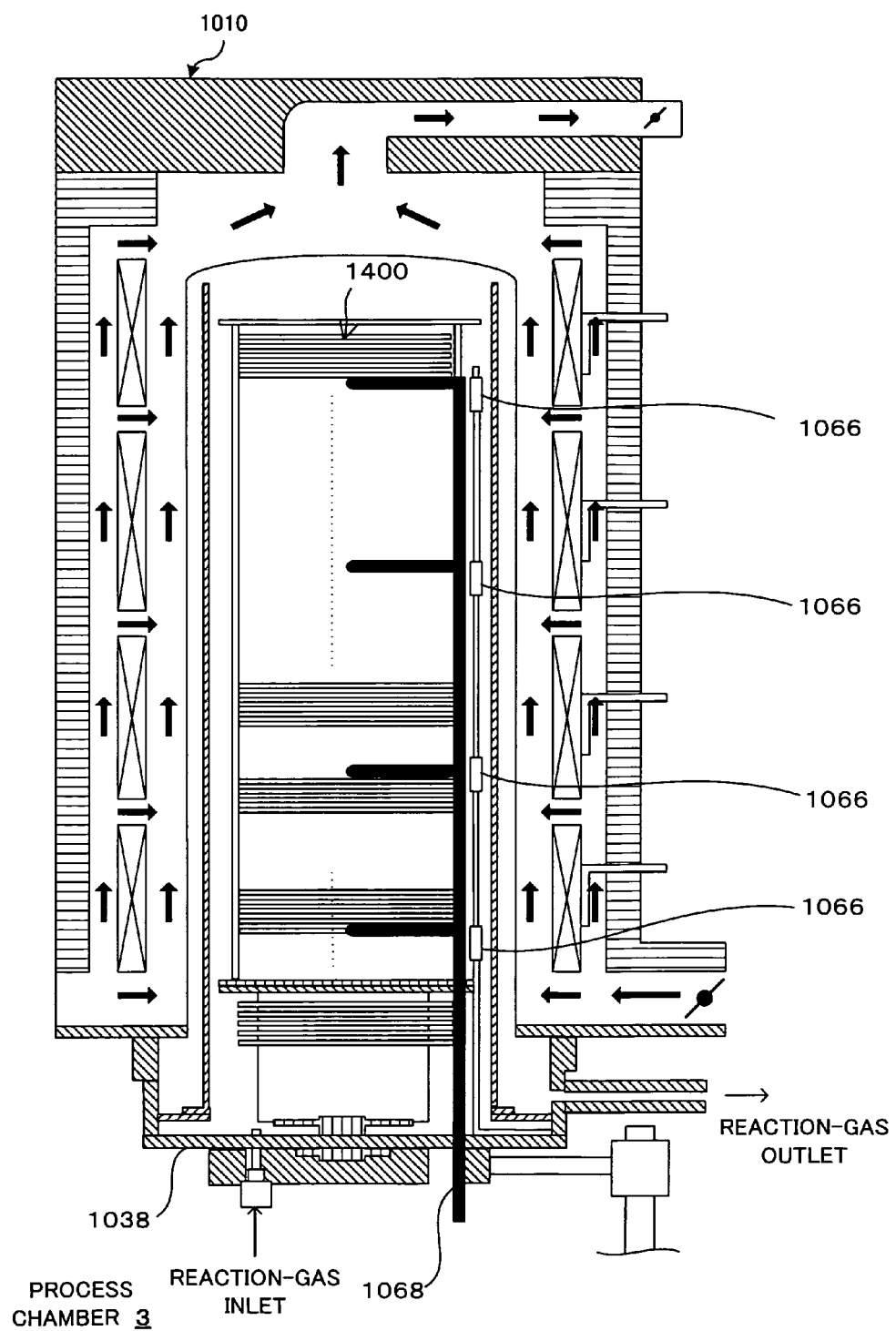
FIG. 11 is a view typically showing the arrangement of a center thermocouple possessed by the semiconductor manufacturing apparatus according to the third embodiment of the invention.

FIG. 11 shows an example of a detailed structure of center thermocouple 1068.

As shown in FIG. 11, center thermocouple 1068 is formed in L-form, for example, in plurality of points in order to measure the temperature of wafers 1400, at around the center thereof, in a height nearly equal to third thermocouple 1066, to output a temperature measurement value. Meanwhile, before semiconductor manufacturing apparatus 1010 starts the processing of wafers 1400, center thermocouple 1068 measures the temperature of wafers 1400, at around the center thereof, in a plurality of points wherein it can be removed when semiconductor manufacturing apparatus 1010 performs processing on wafers 1400. In this manner, because center thermocouple 1068 is structured removable from reactor tube 1014, center thermocouple 1068 can be prevented from contacting with another member by removing center thermocouple 1068 when rotating boat 1044 or when transferring wafers 1400 onto boat 1044. Meanwhile, center thermocouple 1068 is arranged hermetically sealed by interposing a coupling on seal cap 1038.

Figure 12:
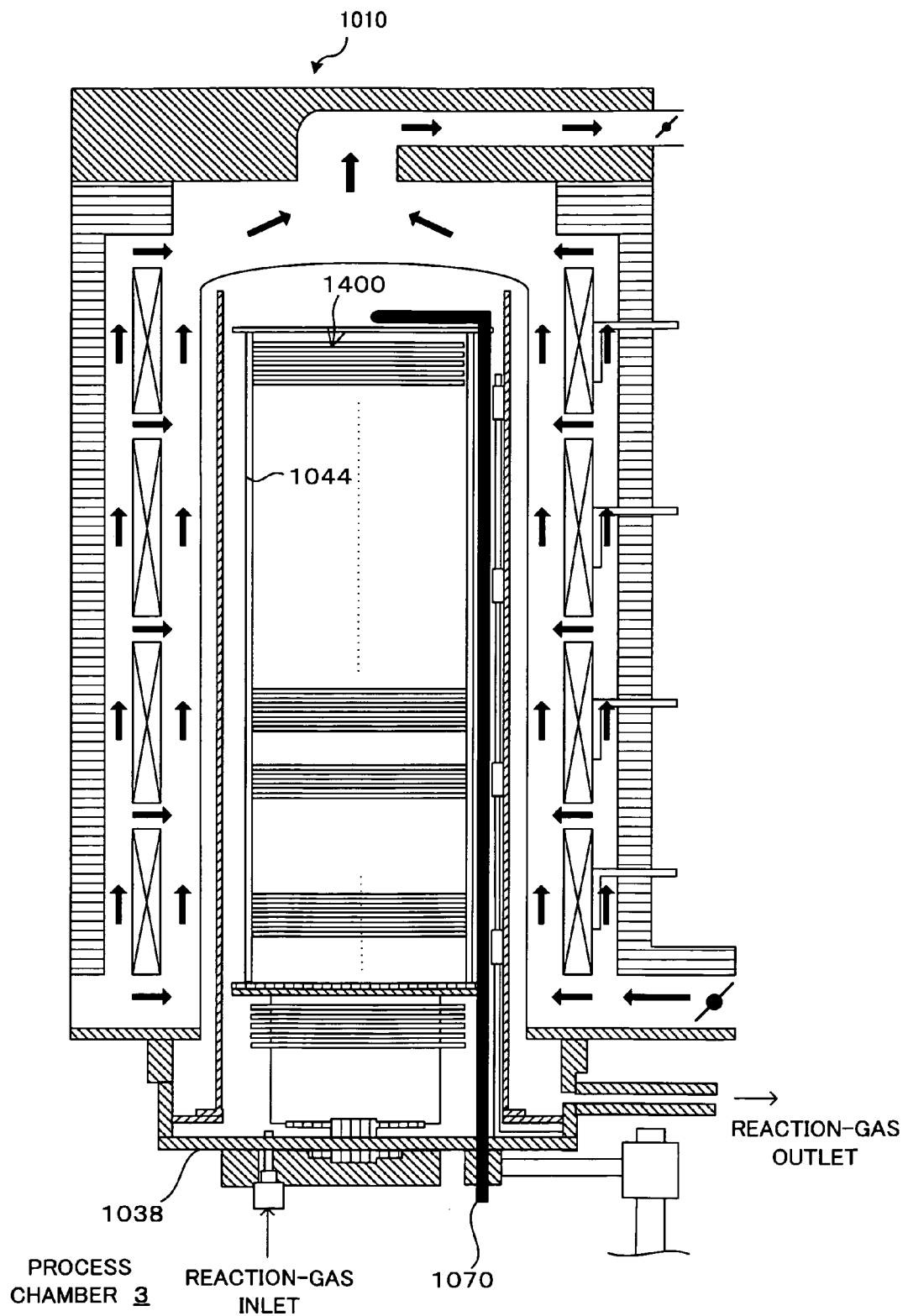
FIG. 12 is a view showing a detailed arrangement example of a ceiling thermocouple possessed by the semiconductor manufacturing apparatus according to the third embodiment of the invention.

FIG. 12 shows an example of a detailed structure of center thermocouple 1070.

As shown in FIG. 12, ceiling thermocouple 1070 has so-called an L-form and is arranged on a top plate of boat 1044, to be used in measuring the temperature of boat 1044 in a position close to the ceiling and outputting a temperature measurement value. Ceiling thermocouple 1070 is arranged higher than the top plate of boat 1044 differently from center thermocouple 1068. Because this allows for loading and unloading to and from boat 1044 and rotating boat 1044, temperature measurement can be done in a position of boat 1044 in a position close to the ceiling in the state of arrangement even when semiconductor manufacturing apparatus 1010 processes wafers 1400. Incidentally, center thermocouple 1070 is arranged hermetically sealed by interposing a coupling on seal cap 1038, similarly to center thermocouple 1068.

Figure 13:
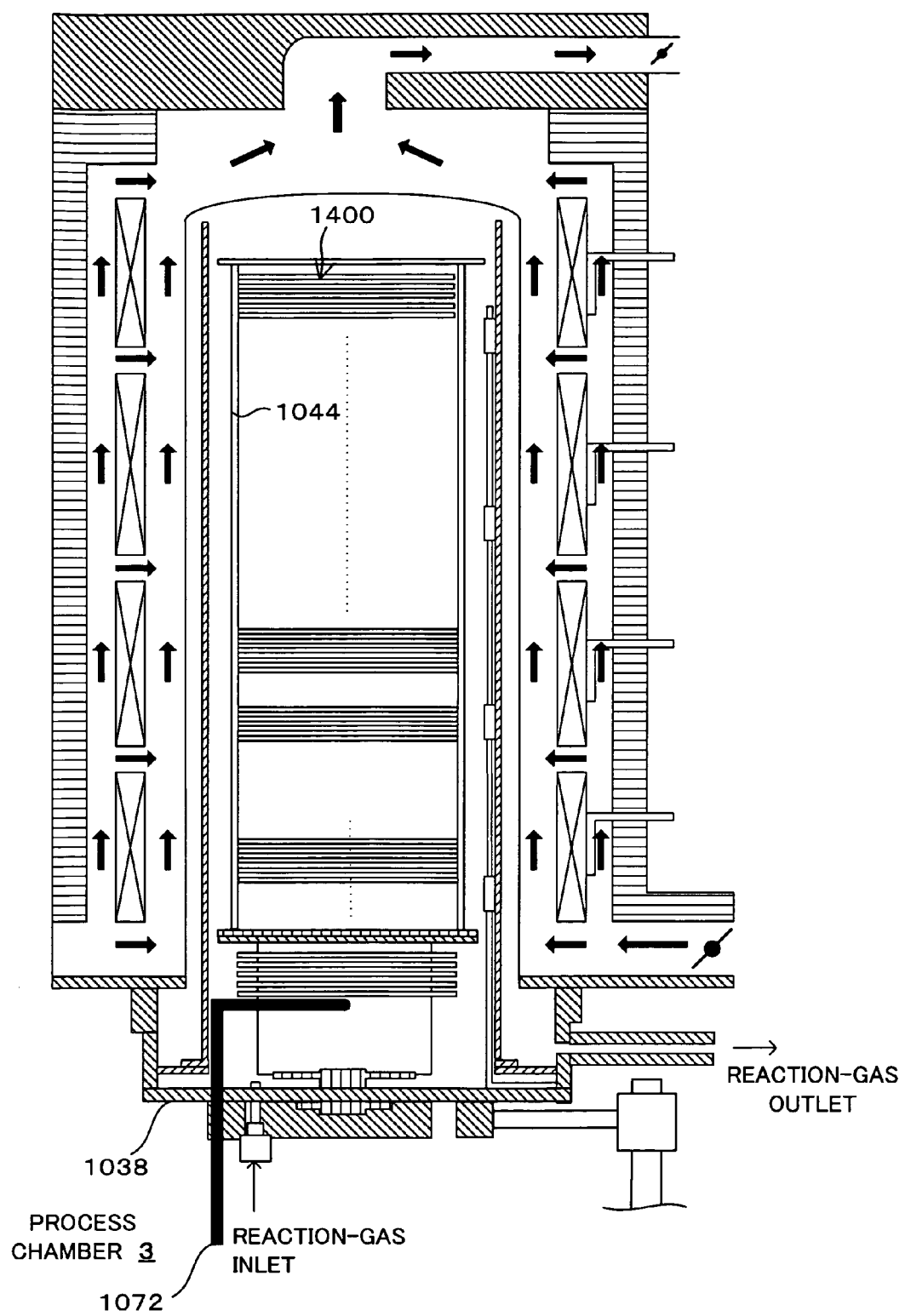
FIG. 13 is a view showing a detailed arrangement example of a lower thermocouple possessed by the semiconductor manufacturing apparatus according to the third embodiment of the invention.

FIG. 13 shows an example of a detailed structure of lower thermocouple 1072.

As shown in FIG. 13, lower thermocouple 1072 has so-called an L-form and is arranged between heat insulation plates in the below of boat 1044, to be used in measuring the temperature in a position below boat 1044 and outputting a temperature measurement value. In place of being provided between vertically adjacent ones of a plurality of heat insulation plates provided below boat 1044, lower thermocouple 1072 may be arranged in a position above the uppermost one of a plurality of heat insulation plates or in a position below the lowermost one of a plurality of heat insulation plates.

Because lower thermocouple 1072 in the state arranged likewise boat 1044 allows for loading and unloading and rotating boat 1044, temperature measurement can be done in a position below boat 1044 in the state of arrangement even when semiconductor manufacturing apparatus 1010 processes wafers 1400. Incidentally, lower thermocouple 1072 is arranged hermetically sealed by interposing a coupling on seal cap 1038.

Now description is made on an operation example where wafers 1400 are subjected to oxidation and diffusion processes within reactor tube 1014 of semiconductor manufacturing apparatus 1010 constructed as above (see FIG. 9).

At first, boat 1044 is lowered by boat elevator 1050. Then, a plurality of wafers 1400 are held on boat 1044. Then, the interior of reactor tube 1014 is raised to a predetermined process temperature by heater 1052.

Reactor tube 1014 is previously filled therein with an inert gas by MFC 1024 connected to gas supply pipe 1016. Boat 1044 is raised by boat elevator 1050 and moved into reactor tube 1014, and the interior of reactor tube 1014 is maintained at a predetermined process temperature. After keeping the interior of reactor tube 1014 at a predetermined pressure, boat 1040 and wafers 1400 held thereon are rotated by rotary shaft 1040. Simultaneously, supplied is a process gas through gas supply pipe 1016 or a water moisture through a moisture producer (not shown). The supplied gas moves down reactor tube 1014, to be supplied evenly over to wafers 1400.

During the oxidation/diffusion process, reactor tube 1014 is purged of the gas through gas outlet pipe 1018, to control the pressure to a predetermined value, thereby performing an oxidation/diffusion process on wafers 1400 for a predetermined time. After completing the oxidation/diffusion process, the gas in reactor tube 1014 is replaced with an inert gas in order for transition into an oxidation/diffusion process on wafer 1400 to be next processed out of wafers 1400 to be processed successively. Simultaneously, the pressure is brought into the normal pressure. Thereafter, boat 1044 is lowered by boat elevator 1050, to take boat 1044 and processed wafer 1400 out of reactor tube 1014.

The processed wafers 1400, on boat 1044 taken out of reactor tube 1014, are replaced with unprocessed wafers 1400. After raised again into reactor tube 1014, wafers 1400 are subjected to an oxidation/diffusion process.

Figure 14:
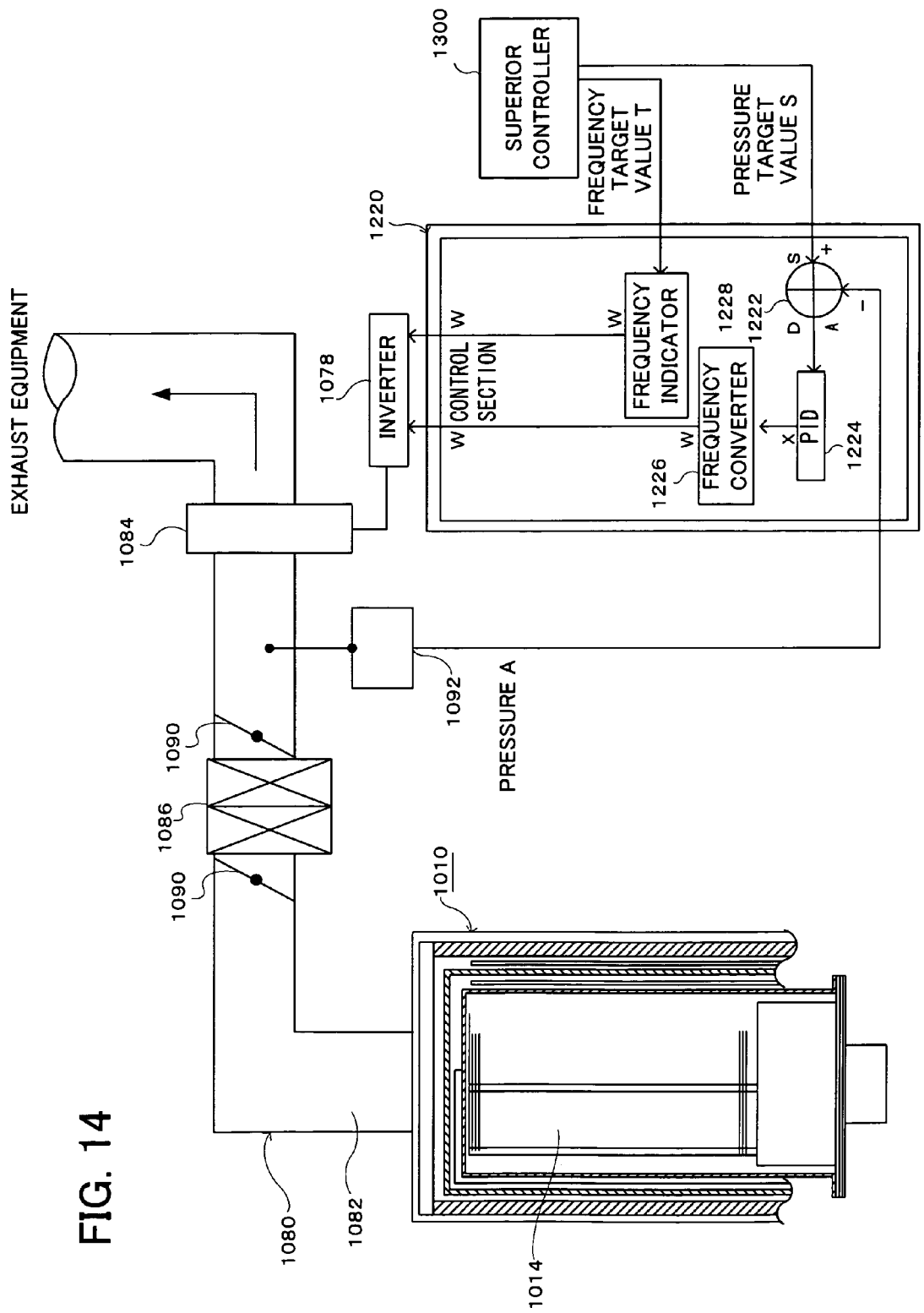
FIG. 14 is a diagram typically showing the arrangement of the semiconductor manufacturing apparatus according to the third embodiment of the invention.

FIG. 14 typically shows a structure that semiconductor manufacturing apparatus 1010 possesses in addition to the structure shown in FIGS. 9 to 13. The structure makes it possible to suppress the variation in thickness of the thin film formed on the wafers 1400 being processed and to form a thin film uniform in thickness.

As shown in FIG. 14, semiconductor manufacturing apparatus 1010 has gas outlet pipe 1082 and exhaust part 1080 (exhaust device) for discharging a cooling gas. Gas outlet pipe 1082, used as cooling-gas outlet passage, has a base end connected, for example, to an upper part of reactor tube 1014 and a tip end connected to an exhaust equipment such as of a factory where semiconductor manufacturing apparatus 1010 is installed. The cooling gas is discharged through gas outlet pipe 1082.

Meanwhile, exhaust part 1080 has cooling-gas discharge device 1084, made for example by a blower, and radiator 1086. Cooling-gas discharge device 1084 is arranged on gas outlet pipe 1082 in a position close to the tip thereof while radiator 1086 is arranged on gas outlet pipe 1082 in a position between the base end thereof and cooling-gas discharge device 1084. Cooling-gas discharge device 1084 is connected with inverter 1078. Inverter 1078 controls the flow rate of the gas to be discharged by cooling-gas discharge device 1084, in a manner controlling the rotational speed of the blower, for example.

Meanwhile, shutters 1090, 1090 are provided on gas outlet pipe 1082 in respective positions upward and downward of radiator 1086 with respect to the direction the cooling gas flows. Shutters 1090, 1090 are opened and closed under control of a shutter control section (shutter control device), not shown.

Pressure sensor 1092 is provided on gas outlet pipe 1082 in a position between radiator 1086 and cooling-gas discharge device 1084, which is to be used as a detecting section (detecting device) for detecting the interior pressure of gas outlet pipe 1082. Here, pressure sensor 1092 is desirably provided on gas outlet pipe 1082 in a position as close as possible to radiator 1086 out of positions between cooling-gas discharge device 1084 and radiator 1086, similarly to that of the first embodiment.

Control section 1200 (control device) has gas flow-rate control section 1202 (gas flow-rate control device), temperature control section 1204 (temperature control device), pressure control section 1206 (pressure control device) and drive control section 1208 (drive control device) (see FIG. 9) as noted before, and further cooling-gas flow-rate control section 1220 (cooling-gas flow-rate control device) in addition to those, as shown in FIG. 11.

Cooling-gas flow-rate control section 1220 is configured with subtracter 1222, PID operator 1224, frequency converter 1226 and frequency indicator 1228.

A pressure target value "S" is inputted from superior controller 1300 to subtracter 1222. Meanwhile, in addition to the pressure target value "S", a pressure value "A" measured at pressure sensor 1092 is inputted to subtracter 1222. Subtracter 1222 outputs a difference "D" which the pressure value "A" is subtracted from the pressure target value "S".

The difference "D" is inputted to PID operator 1224. PID operator 1224 performs PID operation depending upon the inputted difference "D" and calculates an operation amount "X". The calculated operation amount "X" is inputted to frequency converter 1226 where frequency converter 1226 converts it into a frequency "W" and outputs the same. The outputted frequency "W" is inputted to inverter 1078 thereby changing the frequency for cooling-gas discharge device 1084.

The pressure value "A" from pressure sensor 1092 is inputted to subtracter 1222 at all times or at a predetermined time interval. Based on the pressure value "A", the frequency for cooling-gas discharge device 1084 is continuously controlled in a manner bringing the difference "D" between a pressure target value "S" and a pressure value "A" to zero.

In place of calculating the frequency "W" at PID operator 1224, the frequency for cooling-gas discharge device 1084 may be changed by inputting a frequency setting value "T" from superior controller 1300 to frequency indicator 1220 and a frequency "W" from frequency indicator 1220 to inverter 1078.

As described above, in semiconductor manufacturing apparatus 1010, temperature control is made by cooling the wires, structuring heater 1052, and reactor tube 1014 through use of a cooling mechanism using cooling-gas discharge device 1084 that flows air, used as a cooling medium, between heater 1052 at its inner side and reactor tube 1014. Consequently, wafers 1400 held in reactor tube 1014 is temperature-controlled well.

Namely, heat transmission includes radiation-based heat transmission and transfer-based heat transmission. In semiconductor manufacturing apparatus 1010, the radiation-based heat only is conveyed to wafer 1400, contributing to temperature rise in wafer 1400. Transfer-based heat is cooled in its major part by the air flowing between heater 1052 at its inner side and reactor tube 1014, thus being released away. For this reason, the output of heater 1052 is increased in order to supplement the heat in an amount released nearby the wire of heater 1052 by air cooling. By output increase of heater 1052, the wire temperature of heater 1052 increases to increase radiant heat. Here, radiation-based heat transmission is by far greater in propagation speed as compared to transfer-based heat transmission. Consequently, temperature controllability is well in semiconductor manufacturing apparatus 1010 that the wafers within reactor tube 1014 are heated up by radiant heat.

Meanwhile, the temperature of reactor tube 1014 lowers due to the cooling with air. In case the temperature of reactor tube 1014 lowers, heat transfers from the edge of wafer 1400 to reactor tube 1014. As a result, the temperature on wafer 1400 distributes lower at the edge than the center, thus making it possible to change the temperature distribution from so-called a concave type that temperature is higher at the edge than the center into so-called a convex type that temperature is lower at the edge than the center.

Assuming that temperature distributes uniform over wafer 1400, the film formed on wafer 1400 has a thickness in a concave type grater at the edge than the center. On the contrary, in case temperature distribution is provided in a convex form over wafer 1400 by controlling temperature as above, the film on wafer 1400 can be improved in thickness uniformity.

Meanwhile, in semiconductor manufacturing apparatus 1010, gas outlet pipe 1082 is connected, at its tip end, with an exhaust equipment such as of a factory where semiconductor manufacturing apparatus 1010 is installed, to discharge the cooling gas from reactor tube 1014 through gas outlet pipe 1082. For this reason, cooling-gas discharge device 1084 has a cooling effect possibly varies greatly depending upon the pressure at the exhaust equipment such as of a factory. Because the variation of cooling effect at cooling-gas discharge device 1084 has an effect upon the temperature distribution over the surface of wafer 1400, the frequency for cooling-gas discharge device 1084 is controlled such that the exhaust from gas outlet pipe 1082 is at a constant pressure.

Meanwhile, in semiconductor manufacturing apparatus 1010, there is a possibility that, when maintenance is made, e.g. exchanging a thermocouple such as first thermocouple 1062, error occurs in the position where first thermocouple 1062 is attached thus raising a deviation in thickness of the film between wafer 1400 processed before the maintenance and wafer 1400 processes after the maintenance. Meanwhile, where there are a plurality of semiconductor manufacturing apparatuses 1010 that are same in specification, the films respectively formed by semiconductor manufacturing apparatuses 1010 possibly different in thickness.

Therefore, in semiconductor manufacturing apparatus 1010 according to the invention, devising is further made in order to improve the thickness uniformity between the films formed before and after maintenance or between the films formed by a plurality of semiconductor manufacturing apparatuses 1010 common in specification.

Namely, in semiconductor manufacturing apparatuses 1010, previously acquired are a center temperature of wafer 1400, i.e. a value from center thermocouple 1068, and a ceiling temperature of boat 1044, i.e. a value from ceiling thermocouple 1070, when wafer 1400 is under control to a predetermined temperature depending upon the output of second thermocouple 1064. After conducted a maintenance for example, a correction value for a pressure setting value (deviation from the atmosphere) is to be calculated from the acquired data. This is detailed in the following.

Figure 15:
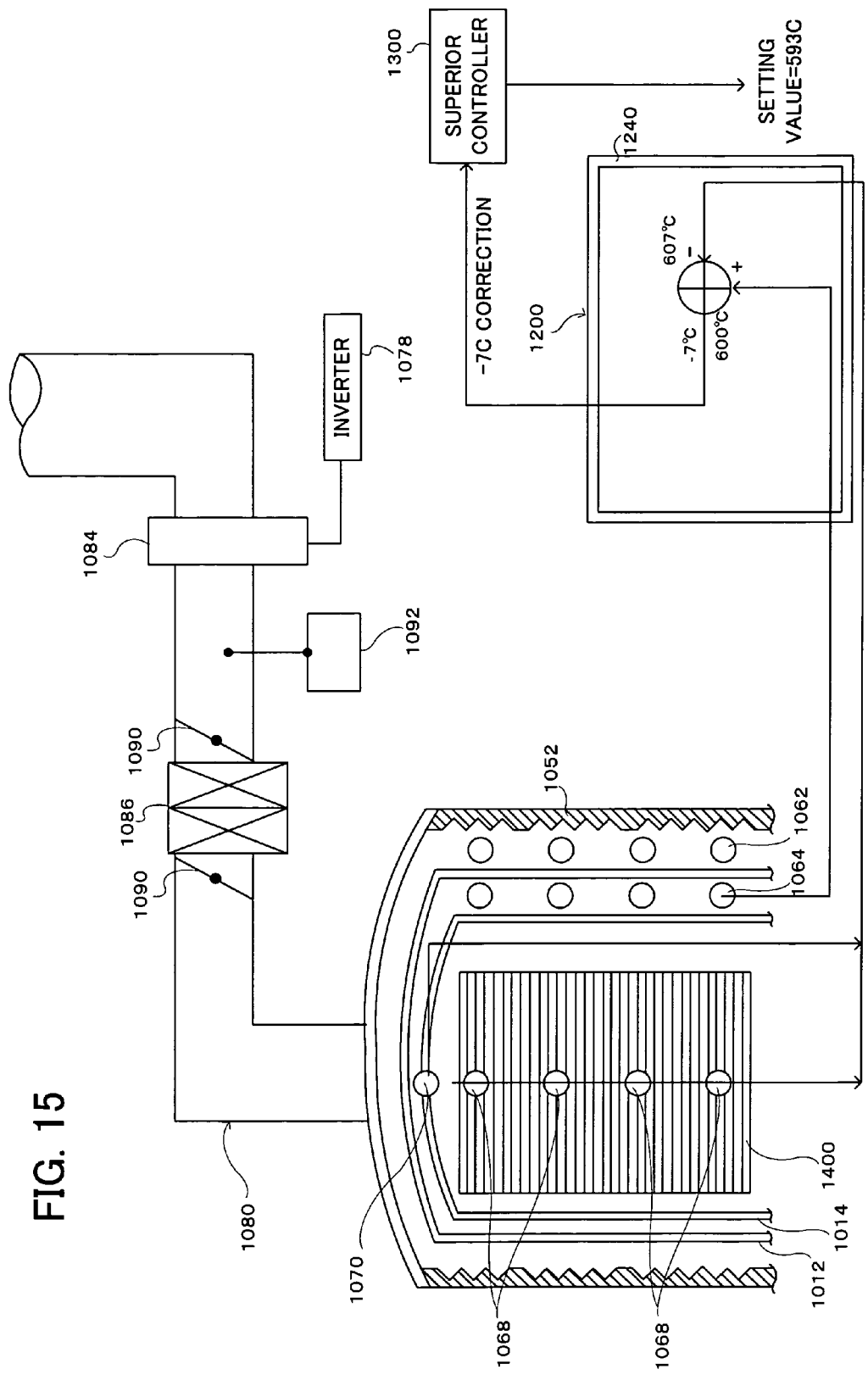
FIG. 15 is an explanatory diagram of the semiconductor manufacturing apparatus according to the third embodiment of the invention, explaining the structure/method for correcting the setting temperature by use of a wafer-center-temperature correction value.

FIG. 15 illustrates a structure/method that corrects a setting temperature by use of a center-temperature correction value for wafer 1400. The foregoing control section 1200 had wafer-center-temperature correction calculating section 1240 (wafer-center-temperature correction calculating device).

Here, description is on an example that the temperature based on second thermocouple 1064 is taken 600° C. Wafer-center-temperature correction calculating section 1240 acquires an output value from center thermocouple 1068 (temperature-at-wafer-center) and an output value from ceiling thermocouple 1070 (temperature-at-ceiling) under control of second thermocouple 1064, and stores respective differences from the output value (internal temperature) from second thermocouple 1064.

In this case, storage is as:

internal temperature−temperature-at-wafer-center=temperature-at-wafer-center deviation or internal temperature−temperature-at-ceiling=temperature-at-ceiling deviation.

Simultaneously, the pressure setting value at that time is also stored. The pressure setting value is changed while keeping the setting temperature constant, to acquire the above data under a plurality of conditions.

For example, an example is taken that setting temperature is 600° C., internal temperature is 600° C. and temperature-at-wafer-center is 607° C. In case internal temperature is considered as a temperature at the edge of wafer 1400, a temperature-at-wafer-center of 607° C. is provided wherein there is an occurrence of deviation though setting temperature is 600° C.

Consequently, by correcting the setting value through outputting (temperature deviation at wafer center=600° C.−607° C.=−7° C.) to superior controller 1300, temperature can be changed at center of wafer 1400 into 600° C.

FIG. 16 shows an example of a plurality of ones of data acquired.

Now, description is made on the calculation of a pressure correction value.

Provided that the current temperature deviation at boat ceiling is t1, the current pressure setting value is p1, the temperature correction value at boat ceiling corresponding to p1 is b1, the positive pressure measurement value in acquired data is pp, the temperature correction value of plus at boat ceiling is tp, the negative pressure measurement value in acquired data is pm and the temperature correction value of minus at boat ceiling is tm, then a pressure correction amount px is to be determined from the following equations (11) and (12) in accordance with the magnitude of t1 and b1.

Namely, it can be determined as:

in the case of t1<b1, $$px=(b1-t1)*\{(p1-pm)/(b1-tm)\} \quad \text{(equation 11), and}$$

in the case of t1>b1, $$px=(b1-t1)*\{(pp-p1)/(tp-b1)\} \quad \text{(equation 12).}$$

In the following, explanation is made on each of the cases of t1<b1 and t1>b1 while showing concrete examples.

Figure 17:
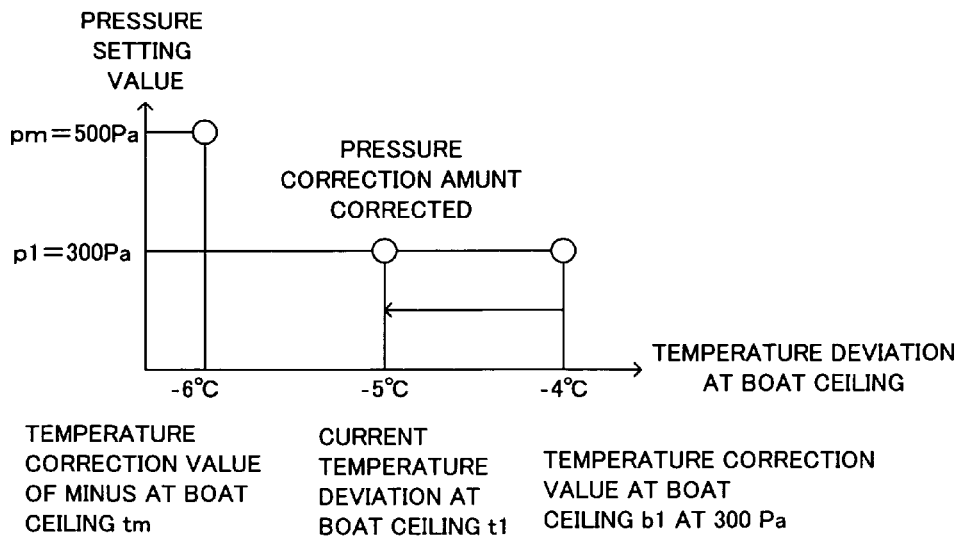
FIG. 17 is a first figure explaining the calculation of a pressure correction amount for the semiconductor manufacturing apparatus according to the third embodiment of the invention.

FIG. 17 explains the calculation of a pressure correction amount px for the case t1<b1.

At first, a difference, between a previously acquired temperature deviation at boat ceiling b1 and a current temperature deviation at boat ceiling b1, is determined as b1−t1.

Then, a pressure correction amount for changing +1° C. the temperature deviation at boat ceiling is determined as (p1−pm)/(b1−tm) in accordance with the relationship between "the current pressure setting value p1 and the corresponding temperature deviation at boat ceiling b1" and "the negative pressure value pm and the corresponding temperature deviation at boat ceiling tm", from previously acquired data.

In the example shown in FIG. 17, the temperature correction value at boat ceiling corresponding to 300 Pa is −4° C. Thus, −6° C. is extracted as negative data from No. 4 in FIG. 16.

Meanwhile, from the previously acquired data, the temperature deviation at boat ceiling b1 is −4° C. at a pressure setting value p1 of 300 Pa.

For changing the temperature deviation at boat ceiling tm by +2° C. from −6° C. to −4° C. at a pressure setting value pm of 500 Pa, the following pressure correction amount is required:

300 Pa(p1)−500 Pa(pm)=−200 Pa.

Consideration is made on an example that the current pressure measurement value is 300 Pa and the current temperature deviation at boat ceiling obtained from the measurement result is −5° C.

In this case, the temperature correction value at boat ceiling corresponding to the currently used pressure setting value is taken as a search key. The correction values at boat ceiling that are respectively most approximate to the search key positively and negatively are selected out of the plurality of ones of data acquired shown in FIG. 16, to perform calculation from the selected data.

From the above, the following is determined:
pressure correction amount of +1° C.=−200 Pa/+2° C.=−100 Pa/° C.

Namely, because (b1−t1) is to be corrected in an amount of +1° C., the pressure correction amount is calculated as:

+1° C.*(−100 Pa/° C.)=−100 Pa.

Figure 18:
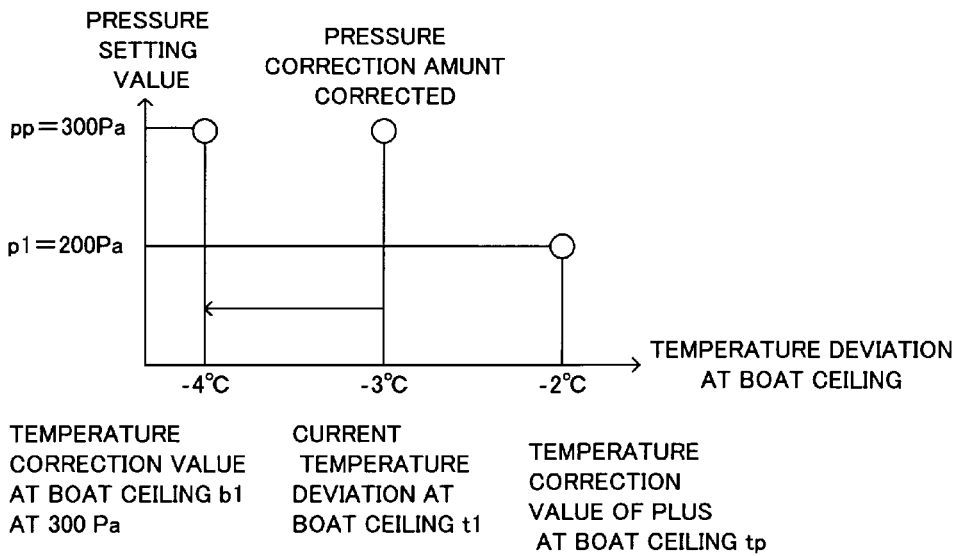
FIG. 18 is a second figure explaining the calculation of a pressure correction amount for the semiconductor manufacturing apparatus according to the third embodiment of the invention.

FIG. 18 explains the calculation of a pressure correction amount px for the case t1>b1.

At first, a difference, between a previously acquired temperature deviation at boat ceiling b1 and a current temperature deviation at boat ceiling b1, is determined.

Then, a pressure correction amount for changing −1° C. the temperature deviation at boat ceiling is determined as (pp−p1)/(tp−b1) in accordance with the relationship between "the current pressure setting value p1 and the corresponding temperature deviation at boat ceiling b1" and "the positive pressure value pp and the corresponding temperature deviation at boat ceiling tp", from previously acquired data.

Here, taking an example that the current pressure measurement value is 300 Pa and the current temperature deviation at boat ceiling obtained from the measurement result is −3° C., the temperature deviation at boat ceiling by is −4° C. at a pressure setting value pp of 300 Pa according to the previously acquired data shown in FIG. 16. Meanwhile, the temperature deviation at boat ceiling tp is −2° C. at a pressure setting value p1 of 200 Pa.

Accordingly, for changing the temperature −2° C. from the temperature deviation at boat ceiling tp of −2° C. to by or −4° C., the following pressure correction amount is required:

300 Pa(p1)−200 Pa(pp)=+100 Pa.

Namely, the temperature correction value at boat ceiling corresponding to 300 Pa is −4° C., to detect −2° C. as a positive side from No. 2 in FIG. 16.

From the above, the following is determined:
pressure correction amount of +1° C.=−100 Pa/+2° C.=−50 Pa/° C.

In this example, because correction is desirably in an amount of (b1−t1)=−1° C., a pressure correction amount is calculated as −1° C.*(−50 Pa/° C.)=+50 Pa.

The above explained the pressure correction amount px where any one of the temperature deviation at boat ceiling t1 and temperature correction value at boat ceiling by is greater than the other. However, correction is not required where t1 and b1 are of the same value.

Meanwhile, in the pressure correction value calculation explained above, a pressure correction amount for raising 1° C. the temperature deviation at boat ceiling was determined in accordance with the relationship between a positive or negative pressure value detected and corresponding temperature deviation at boat ceiling and a current pressure setting value p1 and corresponding temperature deviation at boat ceiling b1. This is because the pressure correction amount is considered to change with the temperature at boat ceiling.

For example, there is not always an agreement between the pressure correction amount for changing +2° C. the temperature correction value at boat ceiling from −6° C. to −4° C. and the pressure correction amount for changing +2° C. the value from −4° C. to −2° C., which is because of the change in the radiant heat from the wire of heater 1052, a heat transfer from wafer 1400 at its edge to reactor tube 1014, and the change in the relationship of heat transfer at between the center of wafer 1400 and the edge of wafer 1400.

Therefore, semiconductor manufacturing apparatus 1010 according to the present embodiment is to calculate a pressure correction amount by use of a negative temperature deviation at boat ceiling and a pressure setting value when the current temperature deviation at boat ceiling is lower than the temperature deviation at boat ceiling corresponding to the current pressure setting value, and a pressure correction amount by use of a positive temperature deviation at boat ceiling and a pressure setting value when the current temperature deviation at boat ceiling is higher than the temperature deviation at boat ceiling corresponding to the current pressure setting value, in order to calculate a pressure correction amount from the approximate situation the temperature correction value at boat ceiling deviates.

Now, description is made on a fourth embodiment according to the invention.

The third embodiment determined a pressure correction amount px by use of a temperature correction value at boat ceiling whereas the fourth embodiment is to determine a pressure correction amount Px by use of a film thickness on wafer 1400 previously subjected to film-forming processing. This is explained in detail in the following. In the explanation, the data of film thickness, etc. measured on wafer 1400 on which a film was previously formed under predetermined conditions.

Provided that the current film thickness of wafer 1400 is a1, the current pressure setting value is p1, the film thickness corresponding to the current pressure setting value p1 is c1, the positive pressure measurement value searched is pp, the film thickness of plus in a plurality of ones of data previously acquired is pc, the negative pressure measurement value in a plurality of ones of data previously acquired is pm and the film thickness of minus is tc, then a pressure correction amount px is determined by equations (21) and (22) in accordance with the magnitude of the current film thickness a1 and the film thickness c1 corresponding to the current pressure setting value p1:

Namely, it can be determined as:
in the case of a1<c1, $$px=(c1-a t1)*\{(p1-pm)/(c1-tc)\} \qquad \text{(equation 21), and}$$

in the case of a1>c1, $$px=(c1-a1)*\{(pp-p1)/(pc-c1)\} \qquad \text{(equation 22).}$$

In the following, explanation is made on each of the cases of a1<c1 and a1>c1 while showing concrete examples.

Figure 20:
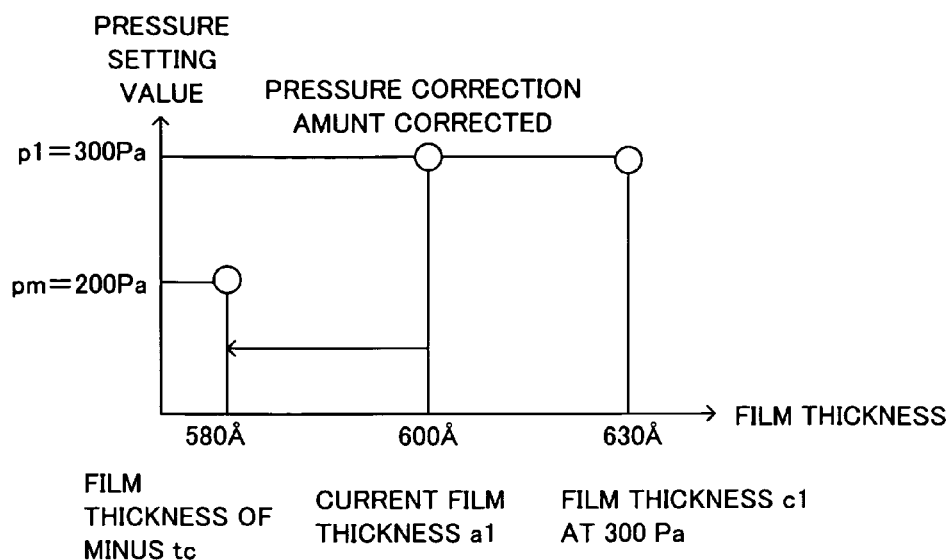
FIG. 20 is a first figure explaining the calculation of a pressure correction amount for a semiconductor manufacturing apparatus according to a fourth embodiment of the invention.

FIG. 20 explains the calculation of a pressure correction amount px for the case a1<c1.

At first, a difference, between a previously acquired film thickness c1 and a current film thickness a1, is determined as c1-a1.

Then, a pressure correction amount for changing −1 angstrom the film thickness is determined as (p1−pm)/(c1−tc) in accordance with the relationship between "the current pressure setting value p1 and the corresponding film thickness c1" and "the detected negative pressure value pm and the corresponding film thickness tc", from previously acquired data. Namely, as shown in FIG. 19, the film thickness corresponding to a pressure measurement value 300 Pa is 630 angstroms. Thus, 580 angstroms is to be extracted as negative data from No. 2.

According to the previously acquired data shown in FIG. 19, the film thickness c1 is 630 angstroms at a pressure setting value p1 of 200 Pa. The film thickness tc is 580 angstroms at a pressure setting value pm of 200 Pa. Namely, for changing 50 angstroms the film thickness tc from 580 to 630 angstroms, the following pressure correction amount is required:

300 Pa(p1)−200 Pa(pm)=+100 Pa.

Consideration is made on an example that the current pressure measurement value is 300 Pa and the film thickness obtained from the measurement result is 600 angstroms.

In this case, the film thickness corresponding to the currently used pressure setting value is taken as a search key. Those of data respectively storing the film thickness most approximate to the search key positively and negatively are selected out of the previously measured values shown in FIG. 19, to perform calculation from the selected data.

From the above, the following is determined:

pressure correction amount of +1 angstrom=+100 Pa/50 angstroms=+2 Pa/angstrom.

Namely, because correction is desirably in an amount of c1-a1 =+30 angstroms, the pressure correction amount is calculated as:

+30 angstroms*(+2 Pa/angstrom)=+60 Pa.

Figure 21:
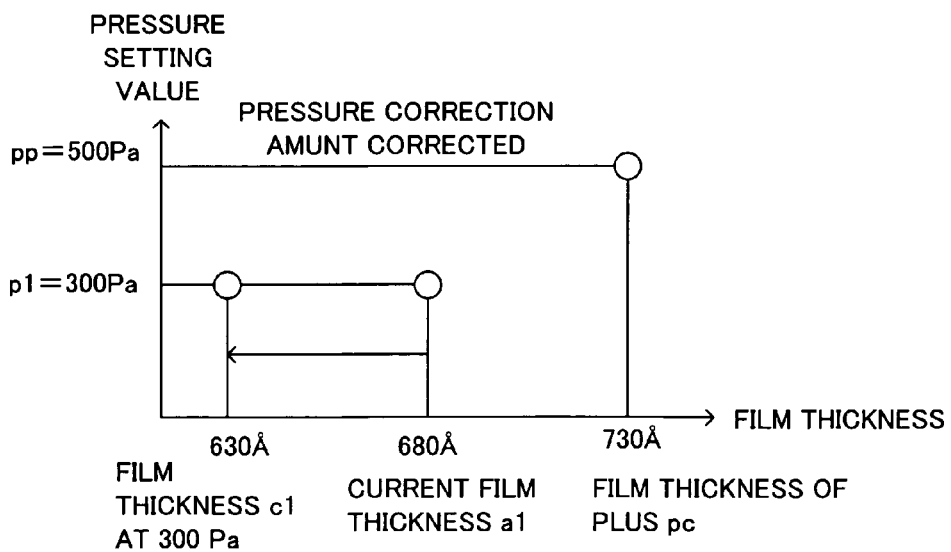
FIG. 21 is a second figure explaining the calculation of a pressure correction amount for a semiconductor manufacturing apparatus according to a fourth embodiment of the invention.

FIG. 21 explains the calculation of a pressure correction amount px for the case a1>c1.

At first, a difference, between a previously acquired film thickness c1 and a current film thickness a1, is determined similarly to the foregoing case of a1<c1.

Then, a pressure correction amount for increasing +1 angstrom the film thickness is determined as (pp−p1)/(pc−c1) in accordance with the relationship between "the current pressure setting value p1 and the corresponding film thickness c1" and "the detected positive pressure value pp and the corresponding film thickness pc", from previously acquired data. Namely, as shown in FIG. 19, the film thickness corresponding to 300 Pa is 630 angstroms. Thus, 730 angstroms at No. 4 is detected as positive data in FIG. 19.

According to the previously acquired data shown in FIG. 19, the film thickness c1 is 630 angstroms at a pressure setting value p1 of 300 Pa. Meanwhile, the film thickness pc is 730 angstroms at a pressure setting value pp of 500 Pa. Namely, for changing −100 angstroms the film thickness tc from 730 to 630 angstroms, the following pressure correction amount is required:

300 Pa(p1)−500 Pa(pp)=−200 Pa.

Consideration is made on an example that the current pressure measurement value is 300 Pa and the film thickness obtained from the measurement result is 680 angstroms.

In this case, the film thickness corresponding to the currently used pressure setting value is taken as a search key. Those of data respectively storing the film thickness most approximate to the search key positively and negatively are selected out of the previously measured values shown in FIG. 19, to perform calculation from the selected data.

From the above, the following is determined:

pressure correction amount of +1 angstrom=−200 Pa/−100 angstroms=+2 Pa/angstrom.

Namely, because correction is desirably in an amount of (c1−a1)=−50 angstroms, the pressure correction amount is calculated as:

−50 angstroms*(+2 Pa/angstrom)=−100 Pa.

Although the pressure correction amount px was explained in the above on the case that any one of the current film thickness a1 of wafer 1400 and the film thickness c1 corresponding to the current pressure setting value p1 is greater than the other, correction is not required where a1 and c1 are of the same value.

In the pressure correction value calculation, a pressure correction amount for increasing 1 angstrom the film thickness was determined in accordance with the relationship between a positive or negative pressure value detected and corresponding film thickness and a current pressure setting value p1 and corresponding film thickness c1. This is because the pressure correction amount is considered to change with the film thickness.

For example, the pressure correction amount for changing +50 angstroms the film thickness from 580 to 630 angstroms is not necessarily equal to the pressure correction amount for changing +50 angstroms it from 630 to 680 angstroms because of the change in the heat amount undergone by wafer 1400 due to a change in radiant heat from the wire of heater 1052, a heat transfer from wafer 1400 at its edge to reactor tube 1014, and a change in the relationship of heat transfer at between the center of wafer 1400 and the edge of wafer 1400.

For this reason, semiconductor manufacturing apparatus 1010 according to the present embodiment is to calculate a pressure correction amount by use of a film thickness of minus and a pressure setting value when the current film thickness is smaller than the film thickness corresponding to the current pressure setting value, and a pressure correction amount by use of a film thickness of plus and a pressure setting value when the current film thickness is greater than the film thickness corresponding to the current pressure setting value, in order to calculate a pressure correction amount from the approximate situation the film thickness changes.

Meanwhile, although the third and fourth embodiments determined a pressure correction amount by use of a temperature correction value at ceiling of boat 1044 measured by ceiling thermocouple 1070, the measurement value due to lower thermocouple 1072 or center thermocouple 1068 can be used in place thereof.

Also, a pressure correction amount may be determined by use of, for example, a mean temperature deviation between two values, i.e., the temperature correction value at boat ceiling measured by ceiling thermocouple 1070 and the lower temperature correction value measured by lower thermocouple 1072, or a mean temperature deviation among three values, i.e., the center-temperature correction value for wafer 1400 measured by center thermocouple 1068 in addition to the two values.

Figure 22:
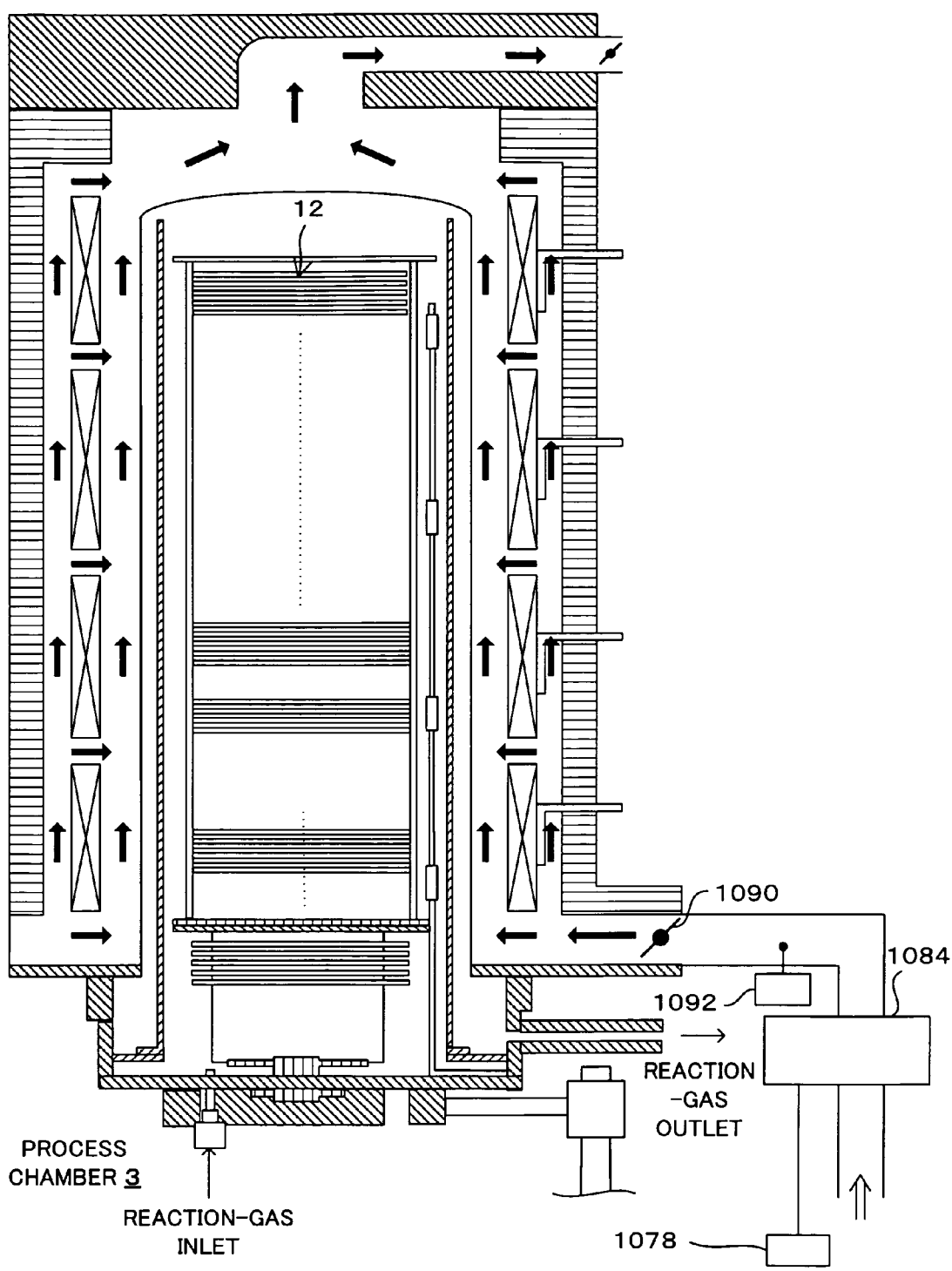
FIG. 22 is a diagram showing the arrangement of a semiconductor manufacturing apparatus according to a fifth embodiment of the invention.

FIG. 22 shows semiconductor manufacturing apparatus 1010 according to a fifth embodiment of the invention.

In semiconductor manufacturing apparatus 1010 of the third or fourth embodiment, cooling-gas discharge device 1084 was arranged on the gas outlet side of reactor tube 1014 whereas, in the fifth embodiment, cooling-gas discharge device 1084 was arranged on the gas supply side thereof.

In the third and fourth embodiments, pressure sensor 1092 was arranged between cooling-gas discharge device 1084 provided on the gas outlet side and radiator whereas, in the fifth embodiment, pressure sensor 1092 can be changed in arrangement location in accordance with the location of cooling-gas discharge device 1084, e.g. between cooling-gas discharge device 1084 provided on the gas supply side and shutter 1090.

Meanwhile, in the first and second embodiments, cooling-gas discharge device 356 may be provided on the gas supply side while the pressure sensor 31 can be changed in location, similarly to the third and fourth embodiments.

As described so far, the invention can be utilized for a substrate processing system and method that the film formed on a substrate is to be controlled in thickness uniformity.

FIG. 1
SEMICONDUCTOR PROCESSING SYSTEM 1

FIG. 2
3. PROCESS CHAMBER
A. COOLING WATER
B. REACTION-GAS OUTLET
C. REACTION-GAS INLET

FIG. 3
3. PROCESS CHAMBER
320. TEMPERATURE REGULATOR
370. TEMPERATURE CONTROL DEVICE
372. TEMPERATURE MEASURING DEVICE
410. TEMPERATURE CONTROL
412. PROCESS-GAS FLOW-RATE CONTROL
424. TEMPERATURE-SETTING STORAGE
414. DRIVE CONTROL
416. PRESSURE CONTROL
418. PROCESS-GAS FLOW-RATE CONTROL
420. TEMPERATURE MEASUREMENT
422. COOLING-GAS FLOW-RATE CONTROL
2. CONTROL SECTION
40. CONTROL PROGRAM
A. COOLING WATER

FIG. 4
22. DISPLAY/INPUT SECTION
204. MEMORY
24. STORAGE SECTION
240. RECORDING MEDIUM
2. CONTROL SECTION
A. TO VARIOUS SECTIONS OF SEMICONDUCTOR PROCESSING SYSTEM

FIG. 5
12. WAFER
1. EDGE
2. CENTER

FIG. 6
3. PROCESS CHAMBER
320. TEMPERATURE REGULATOR
370. TEMPERATURE CONTROL DEVICE
372. TEMPERATURE MEASURING DEVICE
2. CONTROL SECTION
40. CONTROL PROGRAM
400. PROCESS CONTROL SECTION
4226. FREQUENCY INDICATOR
4224. FREQUENCY CONVERTER

FIG. 7
3. PROCESS CHAMBER
320. TEMPERATURE REGULATOR
370. TEMPERATURE CONTROL DEVICE
372. TEMPERATURE MEASURING DEVICE
2. CONTROL SECTION
40. CONTROL PROGRAM
400. PROCESS CONTROL SECTION
422. COOLING-GAS FLOW-RATE CONTROL SECTION
4102. PRESSURE-SETTING ADJUSTING SECTION
424. TEMPERATURE-SETTING STORAGE SECTION

FIG. 8
1. PRESSURE SETTING VALUE
2. TEMPERATURE DISTRIBUTION

FIG. 9
1300. SUPERIOR CONTROLLER
1200. CONTROL SECTION
1204. TEMPERATURE CONTROL SECTION
1202. GAS FLOW-RATE CONTROL SECTION
1206. PRESSURE CONTROL SECTION
1208. DRIVE CONTROL SECTION

FIG. 11
3. PROCESS CHAMBER
A. REACTION-GAS INLET
B. REACTION-GAS OUTLET

FIG. 12
3. PROCESS CHAMBER
A. REACTION-GAS INLET
B. REACTION-GAS OUTLET

FIG. 13
3. PROCESS CHAMBER
A. REACTION-GAS INLET
B. REACTION-GAS OUTLET

FIG. 14
1078. INVERTER
1300. SUPERIOR CONTROLLER
1220. CONTROL SECTION
1228. FREQUENCY INDICATOR
1226. FREQUENCY CONVERTER
A. EXHAUST EQUIPMENT
B. FREQUENCY TARGET VALUE T
C. PRESSURE TARGET VALUE S

FIG. 15
1078. INVERTER
1300. SUPERIOR CONTROLLER
A. −7° C. CORRECTION
B. SETTING VALUE=593° C.

FIG. 16
1. TEMPERATURE SETTING VALUE
2. PRESSURE MEASUREMENT VALUE
3. TEMPERATURE CORRECTION VALUE AT WAFER CENTER
4. TEMPERATURE CORRECTION VALUE AT BOAT CEILING

FIG. 17
1. PRESSURE SETTING VALUE
2. PRESSURE CORRECTION AMOUNT CORRECTED
3. TEMPERATURE CORRECTION VALUE OF MINUS AT BOAT CEILING tm
4. CURRENT TEMPERATURE DEVIATION AT BOAT CEILING t1
5. TEMPERATURE CORRECTION VALUE AT BOAT CEILING b1 AT 300 Pa
6. TEMPERATURE DEVIATION AT BOAT CEILING

FIG. 18
1. PRESSURE SETTING VALUE
2. PRESSURE CORRECTION AMOUNT CORRECTED
3. TEMPERATURE CORRECTION VALUE AT BOAT CEILING b1 AT 300 Pa
4. CURRENT TEMPERATURE DEVIATION AT BOAT CEILING t1
5. TEMPERATURE CORRECTION VALUE AT BOAT CEILING b1 AT 300 Pa
6. TEMPERATURE DEVIATION AT BOAT CEILING

FIG. 19
1. TEMPERATURE SETTING VALUE

2. PRESSURE MEASUREMENT VALUE
3. FILM THICKNESS

FIG. 20
1. PRESSURE SETTING VALUE
2. PRESSURE CORRECTION AMOUNT CORRECTED
3. FILM THICKNESS OF MINUS tc
4. CURRENT FILM THICKNESS a1
5. FILM THICKNESS c1 AT 300 Pa
6. FILM THICKNESS

FIG. 21
1. PRESSURE SETTING VALUE
2. PRESSURE CORRECTION AMOUNT CORRECTED
3. FILM THICKNESS c1 AT 300 Pa
4. CURRENT FILM THICKNESS a1
5. FILM THICKNESS OF PLUS pc
6. FILM THICKNESS

FIG. 22
3. PROCESS CHAMBER
A. REACTION-GAS INLET
B. REACTION-GAS OUTLET

What is claimed is:

1. A substrate processing method comprising:
acquiring a measurement value based on a first detecting section for detecting a state of a peripheral edge of a substrate and a measurement value based on a second detecting section for detecting a state of a center of the substrate and determining a first difference between the measurement value based on the first detecting section and the measurement value based on the second detecting section, comparing between a previously stored second difference between a measurement value concerning the first detecting section and a measurement value concerning the second detecting section with the first difference between the measurement value based on the first detecting section and the measurement value based on the second detecting section, calculating a correction value for a pressure in a cooling-gas passage provided between a process chamber for processing the substrate and a heating device depending upon the first difference when the first difference is different from the second difference, and correcting the pressure value based on the pressure correction value; and
processing the substrate by flowing a cooling gas through the cooling-gas passage by means of a cooling device while heating the process chamber by the heating device, and placing the heating device and the cooling device under control of a control section depending upon a pressure value corrected.

2. The substrate processing method of claim 1, wherein the substrate processing step is to place the substrate at the center and peripheral edge thereof under temperature control by cooling the peripheral edge of the substrate while heating the center of the substrate up to a predetermined process temperature by controlling pressure depending upon the pressure value corrected.

3. The substrate processing method of claim 1, wherein the first detecting section is a first temperature detecting section arranged close to the peripheral edge of the substrate, the second detecting section having a second temperature detecting section arranged in a substrate holder supporting the substrate in a position between substrates, arranged above the substrate holder or arranged below the substrate holder.

4. The substrate processing method of claim 1, wherein the pressure value correcting step has a step of determining the first difference upon heating the process chamber by the heating device such that temperature becomes a predetermined setting value at the center of the substrate in the process chamber,
a step of comparing between the first difference and the second difference for the predetermined setting value of temperature and calculating a correlating relationship between a pressure value through the cooling-gas passage for the predetermined setting value of temperature and the first difference when the first difference is different from the second difference, and
a step of updating the pressure setting value depending upon the correlating relationship calculated.

5. The substrate processing method of claim 4, wherein calculated two or more are correlating relationships between a pressure value through the cooling-gas passage for the predetermined setting value of temperature and the first in-plane difference.

6. The substrate processing method of claim 4, wherein the pressure setting value is detected by a pressure detector that measures an interior pressure value of the cooling-gas outlet passage, communicating with the cooling-gas passage, downwardly of the cooling-gas passage provided between the process chamber and the heating device.

7. The substrate processing method of claim 1, wherein the pressure value correcting step is to correct the pressure value in a manner controlling the uniformity of a film on the substrate.

8. The substrate processing method of claim 1, wherein the substrate processing step is to form a film on the substrate by flowing a process gas into the process chamber.

9. A substrate processing method comprising:
processing the substrate by flowing a cooling gas by a cooling device into a cooling-gas passage provided between a process chamber and a heating device while heating the process chamber for processing the substrate by a heating device and controlling the heating device and the cooling device by a control section depending upon an interior pressure value of the cooling-gas passage; and
comparing between a first film thickness value previously measured on the substrate and a second film thickness value determined in the substrate processing step, and calculating a pressure correction value depending upon the second film thickness value and correcting a pressure value based on the pressure correction value when the first film thickness value is different from the second film thickness value.

10. The substrate processing method of claim 9, further comprising a step of processing a substrate by flowing a cooling gas through the cooling-gas passage by means of the cooling device while heating the process chamber by means of the heating device, and by controlling the heating device and the cooling device by means of the control section depending upon the pressure correction value.

11. The substrate processing method of claim 9, wherein the pressure value correcting step has
a step of determining the second film thickness value upon heating the process chamber by means of the heating device such that temperature becomes a predetermined setting value at the center of the substrate in the process chamber,
a step of comparing between the second film thickness value and the first film thickness value for the predetermined setting value of temperature and calculating a correlating relationship between a pressure value through the cooling-gas passage for the predetermined setting value of temperature and the second film thickness value when the first film thickness value is different from the second film thickness value, and a step of updating the pressure setting value depending upon the correlating relationship calculated.

12. The substrate processing method of claim 11, wherein calculated two or more are correlating relationships between a pressure value through the cooling-gas passage for the predetermined setting value of temperature and the first in-plane difference.

13. The substrate processing method of claim 11, wherein the pressure setting value is detected by a pressure detector that measures an interior pressure value of the cooling-gas outlet passage, communicating with the cooling-gas passage, downstream of the cooling-gas passage provided between the process chamber and the heating device.

14. The substrate processing method of claim 9, wherein the pressure value correcting step is to correct the pressure value in a manner controlling the uniformity of a film on the substrate.

15. The substrate processing method of claim 9, wherein the substrate processing step is to form a film on the substrate by flowing a process gas into the process chamber.

16. A semiconductor manufacturing apparatus comprising:
a process chamber for processing a substrate;
a heating device for heating the process chamber;
a cooling-gas passage provided between the process chamber and the heating device;
a pressure detector for measuring an interior pressure value of the cooling-gas passage; and
a control section for processing the substrate by controlling the heating device and the a cooling device that cools the substrate at a periphery thereof;
whereby the control section acquires a measurement value based on a first detecting section for detecting a state of a peripheral edge of the substrate and a measurement value based on a second detecting section for detecting a state of a center of the substrate and determines a first difference between the measurement value based on the first detecting section and the measurement value based on the second detecting section, compares between a previously stored second difference between a measurement value concerning the first detecting section and a measurement value concerning the second detecting section with the first difference between the measurement value based on the first detecting section and the measurement value based on the second detecting section, calculates a correction value for a pressure in a cooling-gas passage depending upon the first difference when the first difference is different from the second difference, and corrects a pressure value based on a pressure correction value.

17. The semiconductor manufacturing apparatus of claim 16, wherein the heating device heats the substrate in the process chamber from the periphery of the substrate.

18. The semiconductor manufacturing apparatus of claim 16, comprising
a cooling-gas outlet passage communicating with the cooling-gas passage at a downstream of the cooling-gas passage, and
the cooling device communicating with the cooling-gas outlet passage and cooling the substrate at a periphery thereof by flowing a cooling gas through the cooling-gas passage.

19. The semiconductor manufacturing apparatus of claim 16, comprising a pressure detector for detecting an interior pressure value of the cooling-gas outlet passage communicating with the cooling-gas passage at a downstream of the cooling-gas passage, as to a cooling gas flowed through the cooling-gas passage by the cooling device.

* * * * *